United States Patent [19]
Nagasaki et al.

[11] Patent Number: 5,886,863
[45] Date of Patent: Mar. 23, 1999

[54] WAFER SUPPORT MEMBER

[75] Inventors: Koichi Nagasaki; Kazuhiro Kuchimachi; Saburo Nagano; Yasunori Kawanabe; Hiroshi Aida; Kenji Kitazawa, all of Kagoshima, Japan

[73] Assignee: Kyocera Corporation, Kyoto, Japan

[21] Appl. No.: 693,532

[22] Filed: Jul. 25, 1996

[30] Foreign Application Priority Data

| May 19, 1995 | [JP] | Japan | 7-110872 |
| Jul. 25, 1995 | [JP] | Japan | 7-193850 |
| Jul. 31, 1995 | [JP] | Japan | 7-195202 |
| Aug. 31, 1995 | [JP] | Japan | 7-224128 |
| Feb. 29, 1996 | [JP] | Japan | 8-043870 |

[51] Int. Cl.$^6$ .................................................. H02N 13/00
[52] U.S. Cl. ............................................. 361/234; 279/128
[58] Field of Search ........................... 361/234, 230–235; 279/128

[56] References Cited

U.S. PATENT DOCUMENTS

| 4,159,075 | 6/1979 | Ljung et al. | 228/116 |
| 4,273,282 | 6/1981 | Norvell et al. | 228/116 |
| 4,962,441 | 10/1990 | Collins | 361/234 |
| 5,055,964 | 10/1991 | Logan et al. | 361/234 |
| 5,280,156 | 1/1994 | Niori et al. | 219/385 |
| 5,324,053 | 6/1994 | Kubota et al. | 279/128 |
| 5,413,360 | 5/1995 | Atari et al. | 279/128 |
| 5,539,609 | 7/1996 | Collins et al. | 361/234 |

FOREIGN PATENT DOCUMENTS

| 4-287344 | 10/1992 | Japan | H01L 21/68 |

*Primary Examiner*—Fritz Fleming
*Attorney, Agent, or Firm*—Loeb & Loeb LLP

[57] ABSTRACT

A wafer support member comprises a base made of ceramics with thickness of 3 mm or more, a metallic electrode plate with thickness of 0.5 mm or more bonded onto the base, and an attraction surface composed of an aluminum nitride film with thickness of 0.01 to 0.5 mm coated on the surface of the electrode plate. The electrode plate functions as a plasma generating electrode when high frequency voltage is applied to the electrode plate and as an electrostatic attraction electrode when direct-current high voltage is applied to the electrode plate. Also, a wafer holding device for holding a wafer such as semiconductor wafer and glass substrate for liquid crystal is disclosed. The wafer holding device comprises a base body of aluminum nitride sintered body containing resistance heating elements therein. Lead terminals for feeding power to the resistance heating elements are formed in the lower surface of the base body. In one feature, at least the lead terminals and junction thereof are coated with a ceramic film composed of any one of silicon carbide, silicon nitride, sialon, and aluminum nitride. In another feature, the base body has a flat surface for forming an attraction surface, an outer circumference and penetration holes. Each of the penetration holes opens in the flat surface, and has an inner wall. An aluminum nitride film covers the flat surface, the outer circumference, and the inner wall of each of the penetration holes.

17 Claims, 12 Drawing Sheets

WAFER SUPPORT MEMBER

BACKGROUND OF THE INVENTION

The present invention relates to a wafer support member used in fixing, straightening, conveying and the like of wafers in, for example, a semiconductor manufacturing apparatus.

The wafer support member is used in a semiconductor manufacturing apparatus in the process of fixing the semiconductor wafer which is the object of attraction for PVD, CVD, etching, or other processing, or attracting and fixing the semiconductor wafer for straightening the warp, or attracting and conveying the semiconductor wafer.

In the structure of such wafer support member, as shown in FIG. 1, the surface of a ceramic body 11 in which an internal electrode 12 is buried in a attraction surface 11a, and the ceramic body 11 is bonded to a base plate 13 made of metal. By applying a voltage between the internal electrode 12 and attraction object 20, an electrostatic attraction force is generated, and the and the attraction object 20 is attracted and fixed to the attraction surface 11a.

Bonding to the base plate 13 is intended to facilitate assembly into devices, and to cool the attraction object 20 such as wafer by incorporating cooling mechanism (not shown) in the base plate 13. Between this metallic base plate 13 and ceramic body 11, an adhesive layer 14 of metalized compound, organic solvent or glass is interposed to bond, but when temperature change occurs, the ceramic body 11 may be broken due to difference in thermal expansion between the metallic base plate 13 and ceramic body 11.

It is hence attempted to decrease the difference in thermal expansion with the ceramic body 11 by composing the base plate 13 by using metal of low thermal expansion such as tungsten (W), molybdenum (Mo) and Kovar. Or the present applicant proposed to use aluminum (Al) for the base plate 13 and silicone adhesive for the adhesive layer 14 so as to absorb the difference in thermal expansion (Japanese Laid-open Patent 2-287344).

When tungsten or molybdenum is used as the base plate 13, however, processability is poor, and it is hard to incorporate cooling mechanism inside, and it is expensive. Using Kovar, meanwhile, since the thermal conductivity is not high, the cooling effect of the attraction object 20 such as wafer is poor.

On the other hand, by bonding the ceramic body 11 and base plate 13 with the adhesive layer 14 composed of silicone adhesive, the thermal conductivity of the silicone adhesive is relatively low, and if the adhesion thickness fluctuates, it is hard to maintain the wafer or other attraction object 20 at uniform temperature. Along with high speed trend of the wafer processing step, a high electric power is required, for example, in plasma etching, but the wafer cannot be cooled sufficiently in the case of using silicone adhesive.

The invention is intended to compose the wafer support member by bonding the ceramic body having an attraction surface in which an internal electrode is buried, and the base plate, through an adhesive layer composed of indium or indium alloy.

That is, the indium or indium alloy is high in thermal conductivity, and is a flexible metal, and it can release the heat applied to the wafer or attraction object uniformly and quickly, and also absorb the difference in thermal expansion between the ceramic body and base plate.

The invention hence relates to the attraction device such as wafer support member or vacuum chuck used in fixing, heating, filming or processing of silicon wafer in a semiconductor manufacturing apparatus.

In the semiconductor manufacturing apparatus, hitherto, the vacuum chuck or wafer support member has been used as the silicon wafer stage, and in particular the wafer support member is preferably used because it can easily express the flatness or parallelism of the processing surface required at the time of fine processing of wafer in general vacuum.

Moreover, along with the sophistication of degree of integration of semiconductor element, a higher precision is required also in the wafer support member, and a ceramic-made wafer support member has come to be used.

Such high precision ceramic-made wafer support member has been manufactured by sintering integrally by incorporating a conductive layer forming an internal electrode in alumina ceramics (see Japanese Laid-open Patent 62-264638).

In the manufacturing process of semiconductor accompanied by vapor deposition or etching, a halogen derivative plasma is often used, and it is recently proposed to use aluminum nitride ceramics excellent in plasma resistance (Japanese Laid-open Patent 6-151332).

Since, however, other components than AlN are contained in aluminum nitride ceramics, high purity and high density are demanded in the aluminum nitride in order to enhance the plasma resistance. The aluminum nitride film obtained by vapor phase growth method is known to comply with such requirements and be free from adverse effects such as contamination of wafer.

It is hence proposed to obtain a wafer support member excellent in plasma resistance by printing a metal paste as electrode in a specific pattern on a green sheet of ceramics such as alumina and aluminum nitride, laminating and sintering into one body, and forming an aluminum nitride film on the surface of this base body by vapor phase growth method.

Alternatively, the base body may be composed of conductive metal or ceramics, and the wafer support member may be constituted by forming an aluminum nitride film on the surface of the base body as insulating layer.

In any means, the aluminum nitride film must be pure and dense, and the vapor phase growth method is indispensable as the film forming method.

Nevertheless, in the wafer support member forming an aluminum nitride film on the surface, the aluminum nitride film formed by the vapor phase growth method is a uniform and homogeneous film on a horizontal surface, but a sufficient film thickness is not obtained on a vertical surface, such as outer circumference and inner wall of penetration hole.

That is, the wafer support member has an outer circumference, and also penetration holes such as pin holes for moving the attracted wafer or gas holes for leading in gas such as helium, and the aluminum nitride film formed in such vertical surfaces as the outer circumference and inner wall of penetration holes is extremely thin. Hence, by short-time etching by plasma, the base body is exposed on the vertical surface, especially in the edge, and the plasma resistance is impaired.

Recently, moreover, in the trend of higher density of integrated circuit and shorter time of plasma processing, the plasma density increases progressively. By contrast, there has been no wafer support member capable of maintaining an excellent plasma resistance owing to the reasons stated above.

In the invention, accordingly, the base body having penetration holes opening in a flat plane forming an attraction surface is formed of metal or ceramics, the angle formed by the outer circumference of the base body and inner walls of penetration holes with the flat plane is defined at 80° or less, and an aluminum nitride film is applied on the flat plane, outer circumference, and inner walls of penetration holes, thereby composing an attraction device such as wafer support member and vacuum chuck.

That is, according to the invention, the outer circumference of the base body and inner walls of penetration holes are formed in an upward taper at an angle of 80° or less to the flat plane, so that an aluminum nitride film can be formed in a sufficient thickness in the outer circumference and inner walls of penetration holes. As a result, an attraction device extremely resistant to plasma and excellent in durability is obtained.

Also in the invention, a base body having penetration holes opening in a flat plane forming an attraction surface is formed of metal or ceramics, the boundary of the outer circumference of the base body and inner walls of penetration holes with the flat plane is chamfered, and an aluminum nitride film is applied on the flat plane, outer circumference, chamfered part, and inner walls of penetration holes, thereby composing a attraction device such as wafer support member and vacuum chuck.

That is, according to the invention, by chamfering the boundary of the outer circumference of the base body and inner walls of penetration holes with the flat plane, an aluminum nitride film can be formed in a sufficient thickness in the outer circumference and inner walls of penetration holes. Hence an attraction device extremely resistance to plasma and excellent in durability is obtained.

The invention relates to a wafer support member used in fixing, heating, filming, and processing of silicon wafer in a semiconductor manufacturing apparatus of the like.

In the semiconductor manufacturing apparatus, hitherto, the wafer support member used as stage of silicon wafer has been preferably used because flatness and parallelism of the processing surface required in fine processing of wafer in general vacuum can be easily realized.

Moreover, along with the sophistication of degree of integration of semiconductor element, a higher precision is required also in the wafer support member, and a ceramic-made wafer support member has come to be used.

Such high precision ceramic-made wafer support member has been manufactured by sintering integrally by incorporating a conductive layer forming an internal electrode in alumina ceramics (see Japanese Laid-open Patent 62-264638).

In the manufacturing process of semiconductor accompanied by vapor deposition or dry etching, a halogen gas derivative plasma is often used, and it is recently proposed to use aluminum nitride ceramics excellent in plasma resistance as the material for the wafer support member (Japanese Laid-open Patent 6-151332).

In the semiconductor manufacturing process using such plasma, various functions are required in the stage for mounting wafers on. For example, temperature control function for keeping the wafer temperature constant, electrostatic attraction function for keeping the wafer in tight contact with the stage, and plasma generating electrode are required.

If all these functions are realized by one stage, a compact and very efficient system will be made up.

Accordingly, it has been attempted to realize a wafer support member of all-in-one type incorporating all three metal layers of resistance heating element, electrostatic attraction electrode and plasma generating electrode, inside of a ceramic base body. Conventionally, such wafer support member was generally manufactured by printing metal paste for each electrode in a specific pattern on a green sheet of aluminum nitride, and laminating and sintering into one body.

However, when three different metal layers are assembled in a base body made of aluminum nitride, the base body may be cracked, or metal layers may be peeled or broken due to difference in thermal expansion in the sintering process.

In particular, the resistance heating element is a band pattern, whereas the electrostatic attraction electrode and plasma generating electrode are full-face patterns, and these two full-face patterns have a greater effect due to difference in thermal expansion on the ceramic base body.

To improve such problems as far as possible, it may be considered to reduce the electrode thickness to 30 $\mu$m or less, but it causes to limit the high frequency electric power that can be applied to the plasma generating electrode.

That is, when plasma of over 200 W is applied to an electrode of 30 $\mu$m or less, the electrode itself is heated abnormally, and sufficient etching or processing cannot be done, and ultimately the electrode may be burnt down or the ceramic base body may be broken down.

Accordingly, the invention composes a wafer support member by bonding a metal electrode plate in a thickness of 0.5 mm or more on a base body made of ceramics in a thickness of 3 mm or more, and forming an aluminum nitride film in a thickness of 0.01 to 0.5 mm on the surface of the electrode plate to be used as an attraction surface.

That is, in the invention, the electrostatic attraction electrode and plasma generating electrode are composed of metal electrode plates of 0.5 mm or more in thickness, and the ceramic base body and metal electrode plates are bonded in a buffer structure capable of mutually alleviating the difference in thermal expansion. Accordingly, the plasma generating electrode is an electrode plate having a sufficient thickness, and hence it is not heated abnormally or burnt down at high frequency.

According to the wafer support member of the invention, only one layer of a band thin film pattern of 20 $\mu$m or less in thickness is buried in the base body as resistance heating element, an extremely high reliability is obtained same as in general ceramics heater.

The invention also relates to a wafer support member used in forming film or fine processing in a semiconductor wafer in a semiconductor manufacturing apparatus.

Hitherto, in the film forming device for forming a film on a semiconductor wafer or the dry etching device for fine processing in a semiconductor wafer, in a manufacturing process of semiconductor device, the wafer support member is used as the tool for holding the semiconductor wafer at high precision.

Moreover, along with the sophistication of degree of integration of semiconductor element, a higher precision is required also in the wafer support member, and a ceramic-made wafer support member has come to be used.

For example, as known so far, the ceramic base body for composing the wafer support member is formed by alumina ceramics or silicon nitride ceramics, and an electrode for electrostatic attraction is buried in the ceramic base body (see Japanese Laid-open Patent 62-264638).

Or, in the manufacturing process of semiconductor accompanied by vapor deposition or dry etching, a halogen gas derivative corrosive plasma generating plasma is used, and hence the ceramic base body is formed of aluminum nitride ceramics excellent in plasma resistance (Japanese Laid-open Patent 6-151332).

In the wafer support member used in semiconductor manufacturing process using plasma, aside from the electrostatic attraction function for attracting the wafer, temperature control function for keeping the wafer temperature constant and plasma generating function are required, and if all these functions can be integrated, a compact and very efficient wafer support member will be obtained, and hence an all-in-one type wafer support member incorporating all three metal layers of electrostatic attraction electrode, resistance heating element and plasma generating electrode inside of a ceramic base body is proposed.

However, when three layers are assembled in a ceramic base body, the base body may be largely warped or bent, or racked, or electrodes may be peeled or broken due to difference in thermal expansion in the sintering process.

In particular, the electrostatic attraction electrode and plasma generating electrode are full-face electrode patterns, and the ceramic base body was warped significantly by burying these two electrodes.

If the wafer is held by such wafer support member, therefore, flatness precision of the wafer was not obtained, and it had adverse effects on the semiconductor manufacturing process.

To improve such problems as far as possible, it may be considered to reduce the electrode thickness, but if the electrode thickness is less than 0.1 mm, it causes to limit the high frequency electric power that can be applied to the plasma generating electrode.

That is, to generate plasma, power of over 100 W must be applied to the plasma generating electrode, but if the electrode thickness is less than 0.01 mm, the plasma generating electrode is heated abnormally, and sufficient dry etching cannot be processed in the wafer, or the plasma generating electrode may be burnt down, or the ceramic base body may be broken down.

In the light of the above problems, the invention composes the wafer support member by forming a plurality of electrode in a thickness of 0.02 mm or more and maximum length of 5 cm or less on the surface of a ceramic base body, and forming a holding surface by covering the electrodes with an aluminum nitride film of 0.01 to 0.5 mm in thickness. In the invention, moreover, a resistance heating element for heating may be buried in the ceramic base body.

In the invention, a direct-current high voltage for electrostatic attraction and/or a high frequency electric power for generating plasma is applied to the electrodes so as to act as plasma generating electrode as well as electrostatic attraction electrode.

Moreover, in the invention, the ceramic base body is composed of ceramics of which volume resistivity is $10^{10}$ $\Omega \cdot cm$ or more and thermal conductivity is 20 W/m·K, and the electrode are composed of tungsten, molybdenum, or Kovar.

The invention further relates to a wafer holding device such as susceptor and wafer support member for holding the wafer such as semiconductor wafer and glass substrate for liquid crystal used in manufacturing process of semiconductor or liquid crystal substrate.

Hitherto, in the manufacturing process of semiconductor or liquid crystal substrate, in the CVD device for forming a thin film on a wafer such as semiconductor wafer and glass substrate for liquid crystal, the wafer holding device such as susceptor and wafer support member incorporating a resistance heating element was used in order to hold the wafer in the treating chamber and to heat the water to a necessary temperature for forming a film on.

In the susceptor 411, for example, a resistance heating element 413 is buried in a base body 412 made of a disk-shaped aluminum nitride sintered body as shown in FIG. 18, and a lead terminal 415 for feeding power to the resistance heating element 413 is provided in the lower surface of the base body 412.

In the wafer support member 421, moreover, an electrostatic electrode 424 and a resistance heating element 423 are buried inside a base body 422 made of a disk-shaped aluminum nitride sintered body as shown in FIG. 19, and a lead terminal 425 is provided in the lower surface of the base body 422 to feed power to the electrostatic electrode 424 and resistance heating element 423.

For bonding of the electrode 413, and lead terminal 415, (the lead terminals 415, 425 are shown in FIG. 20), an inner hole A is pierced in the lower surface of the base body 412, and a metalized layer B is formed on the surface of the inner hole A, and the lead terminals 415, 425 made of molybdenum, tungsten or other metal are bonded with a solder C.

To form a film on a wafer, however, the wafer holding device such as susceptor 411 and wafer support member 421 must be heated to a temperature over 600° C., and hence the lead terminals 415, 425 of the electrodes 413 and 424 and heating element 423 directly bonded to the base bodies 411, 421 are heated to high temperature in the atmosphere to be oxidized. As a result, the resistance value of the lead terminals 415, 425 is largely changed, and the wafer holding device cannot be heated to specified temperature, and wire breakage may occur in a worst case.

In addition, the solder C for bonding the lead terminals 415, 425 to the base bodies 412, 422 reacts with oxygen in the atmosphere in high temperature state to corrode, and lead terminals 415, 425 may drop out.

Accordingly, it may be considered to cover the lead terminals 415, 425 and their junction with hard-to-oxidize material such as Ni, but the Ni film is poor in reliability, and wafer holding device having sufficient durability has not been obtained.

In the light of the above problems, the invention provides a wafer holding device incorporating a resistance heating element in a base body made of aluminum nitride sinter, and forming a lead terminal for feeding power to the resistance heating element in the lower surface of the base body, wherein at least the lead terminal and its junction are covered with at least one ceramic film selected from the group consisting of silicon carbide, silicon nitride, sialon, and aluminum nitride.

According to the invention, at least the lead terminal and its junction of the lower surface of the base body are covered with a ceramic film excellent in oxidation resistance, so that characteristic deterioration of lead terminal and corrosion of solder can be prevented for a long period.

In the invention, by using one of silicon carbide, silicon nitride, sialon, and aluminum nitride, similar to coefficient of thermal expansion of aluminum nitride sinter, among ceramics, as the ceramic film, tightness of contact with the base body at high temperature can be enhanced. Hence, if the wafer holding device is heated to high temperature, the oxygen in the atmosphere will not invade into the ceramic film, or the ceramic film will not be peeled off. In particular, when aluminum nitride is used as ceramic film, since it is the same material as the aluminum nitride sinter composing the base body, a higher reliability is achieved. Moreover, when the wafer holding device is installed in the treating chamber such as CVD device, the lead terminal and its junction are exposed to halide gas, but when coated with ceramic film made of aluminum nitride, the lead terminal and solder are free from corrosion even in halide gas atmosphere.

DESCRIPTION OF THE PREFERRED EMBODIMENTS

Figure 1:
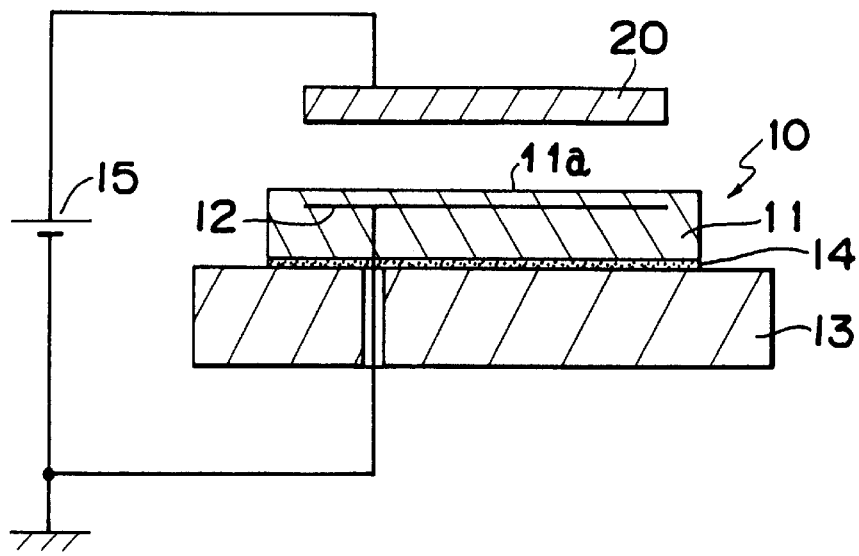
FIG. 1 is a sectional view showing a structure of a general wafer support member.

Referring now to the drawings, embodiments of the invention are described in detail below.

A wafer support member 10 of the invention is structured as shown in FIG. 1, wherein the surface of a ceramic body 11 in which an internal electrode 12 is buried is an attraction surface 11a, and the back side of this ceramic body 11 is bonded to a metallic base plate 13 through an adhesive layer 14 composed of indium or indium alloy. From a power source 15, a voltage is applied between the internal electrode 12 and an attraction object 20 to generate an electrostatic attraction force, so that the attraction object 20 is attracted and fixed to the attraction surface 11a. To cool the wafer, moreover, a cooling structure (not shown) for circulating cooling water may be provided inside the base plate 13.

The ceramic body 11 is composed of ceramics mainly composed of alumina ($Al_2O_3$) or aluminum nitride (AlN), or sapphire, single crystal of alumina, or the like, and the internal electrode 12 is formed of metal such as tungsten.

As the material for the base plate 13, metal such as aluminum (Al) or ceramics such as alumina may be used, and in particular aluminum is preferred because of excellent thermal conductivity, plasma resistance, and processability.

The indium or indium alloy used as adhesive layer 14 for bonding the two is composed of 40 to 100 wt. % of indium (In), and at least one of Sn, Ag, Pb, Ab, Zn and Al by 60 to 0 wt. %, and a specific composition is shown in Table 1.

The indium and indium alloy are low in hardness and excellent in flexibility among various metals as shown in Table 2, and have a far higher thermal conductivity than silicone adhesive as shown in Table 3. Hence, the difference in thermal expansion between ceramic body 11 and base plate 13 can be absorbed, and the heat applied to the attraction object 20 such as wafer can be released quickly and uniformly.

TABLE 1

| | Composition (wt. %) | | | | |
|---|---|---|---|---|---|
| | In | Sn | Ag | Pb | Others |
| 1 | 100 | — | — | — | — |
| 2 | 50 | 50 | — | — | — |
| 3 | 52 | 48 | — | — | — |
| 4 | 50 | 30 | 1 | 19 | — |
| 5 | 90 | — | 10 | — | — |
| 6 | 97 | — | 3 | — | — |
| 7 | 40 | — | — | 60 | — |
| 8 | 45 | — | — | 55 | — |
| 9 | 50 | — | — | 50 | — |
| 10 | 55 | — | — | 45 | — |
| 11 | 60 | — | 2.5 | 37.5 | — |
| 12 | 80 | — | 5 | 15 | — |
| 13 | 99 | — | — | — | Sb 1 |
| 14 | 97 | — | — | — | Zn 3 |
| 15 | 99 | — | — | — | Zn 1 |
| 16 | 99 | — | — | — | Al 1 |

TABLE 2

| Material | Vickers hardness (kg/mm$^2$) |
|---|---|
| Indium (In) | 0.9 |
| Silver (Ag) | 26 |
| Aluminum (Al) | 17 |
| Gold (Au) | 25 |
| Molybdenum (Mo) | 160 |

TABLE 3

| Material | Thermal conductivity (W/m · K) |
|---|---|
| Indium | 82 |
| Silicone adhesive | 0.2 |

Figure 2:
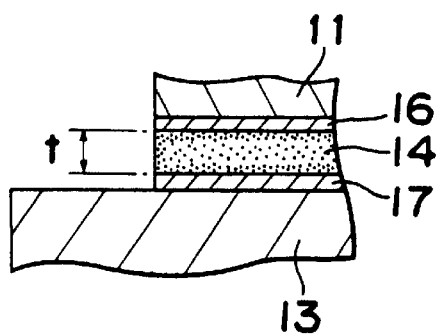
FIG. 2 is a sectional view showing the junction of wafer support member of the invention.

As shown in a magnified view of junction of ceramic body 11 and base plate 13 in FIG. 2, a metalized layer 16 is formed on the junction surface of the ceramic body 11, and a plated layer 17 is formed on the junction surface of the base plate 13, and an adhesive layer 14 is interposed and bonded between them. The metalized layer 16 and plated layer 17 are composed of metal wettable with indium, such as silver, copper and nickel, and the metalized layer 16 and plated layer 17 contribute to the bond strength.

Incidentally, when the base plate 13 is formed of ceramics, a metalized layer may be formed instead of the plated layer 17.

The thickness t of the adhesive layer 14 is preferred to be in a range of 20 to 100 μm. If less than 20 μm, defects may be formed in the adhesive layer 14 and the bonding force is lowered, or if exceeding 100 μm, the mounting precision of the wafer support member 10 is impaired.

Figure 3:
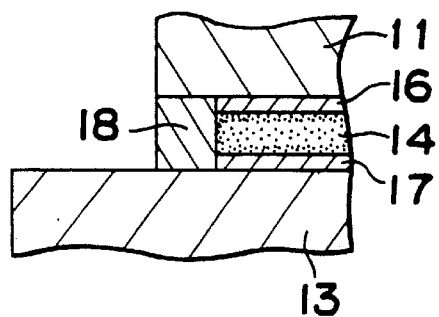
FIG. 3 is a sectional view showing the junction of other embodiment of wafer support member of the invention.

As other embodiment of the invention, as shown in FIG. 3, a protective member 18 may be provided around the adhesive layer 14. This protective member 18 is made of O-ring of fluoroplastics, epoxy adhesive, or other material excellent in plasma resistance, and it can be used in the environments directly exposed to plasma.

A manufacturing method of the wafer support member 10 of the invention is described below.

First, the ceramic body 11 in which the internal electrode 12 is buried is fabricated, by inserting the internal electrode 12 between green sheets, and laminating and sintering into one body, or by forming the internal electrode 12 on the surface of a ceramic body, and covering it with a ceramic layer by CVD method or the like.

On the junction surface at the back side of the ceramic body 11, silver paste is applied by screen printing, and backed at temperature of about 700° C., thereby forming a metalized layer 16. On the other hand, a silver plated layer 17 is formed on the surface of the metallic base plate 13 of aluminum or the like.

Afterwards, paste of indium powder dissolved in alcohol is applied on the metalized layer 16 and plate layer 17 of the ceramic body 11 and base plate 13. As the method of application, it is printed by using a screen of 200 to 400 mesh, and a final thickness t is formed to 20 to 100 μm. After application, by drying until alcohol is sufficiently evaporated, and the ceramic body 11 and base plate 13 are laminated, and heated to temperature higher than the liquid phase temperature of indium (157° C.) so that the indium adhesive layer 14 may be sufficiently wettable with the metalized layer 16 and plated layer 17, and then the temperature is lowered.

As the forming method of adhesive layer 14, meanwhile, a foil of indium may be also used. That is, an indium foil prepared in a thickness of 20 to 100 μm is inserted between the metalized layer 16 and plated layer 17, the ceramic body 11 and base plate 13 are laminated, and heated to temperature higher than the liquid phase temperature of indium (157° C.) so as to be bonded together.

FIG. 1 shows a single-pole type wafer support member, but it is also possible to form a twin-pole type wafer support member having plural internal electrodes so as to feed power to the internal electrodes.

Such wafer support member 10 of the invention may be used for attracting and fixing when conveying or processing the wafer in the semiconductor manufacturing process, and it may be also used in attracting and fixing various substrates such as liquid crystal substrate.

Accordingly, the wafer support member of the invention shown in FIG. 1 was fabricated, and the adhesive layer 14 was formed of silicone adhesive as comparative example. In each sample, after measuring fluctuations of thickness t of the adhesive layer 14, they were put in a plasma etching device, and uniform heating performance of the attraction object 20 was compared. The attraction object 20 was a silicon wafer of 8 inches in diameter, and by heat input (plasma) of 4 kW, fluctuation width of temperature on the wafer was measured.

As a result, as shown in table 4, there was a temperature fluctuation of 5° to 20° C. on the wafer in the adhesive layer 14 made of silicone adhesive. This is because the adhesive layer 14 is low in thermal conductivity, and the cooling performance is different partially depending on the thickness variation.

By contrast, in the embodiment of the invention using indium as adhesive layer 14, the temperature fluctuation on the wafer was less than 1° C. This is because the adhesive layer 14 made of indium is high in thermal conductivity, and there is no effect on cooling performance if there is fluctuation in the thickness t. It is hence known that the wafer support member 10 of the invention can maintain the wafer temperature uniformly if there is fluctuation in the thickness of adhesive layer 14.

TABLE 4

| | Wafer temperature fluctuation | |
|---|---|---|
| Material of adhesive layer | Adhesive layer thickness t 20 to 30 μm (thickness fluctuation 10 μm) | Adhesive layer thickness t 20 to 40 μm (thickness fluctuation 20 μm) |
| Indium | 1° C. or less | 1° C. or less |
| Silicone adhesive | 5–10° C. | 10–20° C. |

Thus, according to the invention, the wafer support member is constituted by bonding the ceramic body having an attraction surface in which the internal electrode is buried, and the base plate, through an adhesive layer made of indium or indium alloy, and since the indium or indium alloy is flexible, it can absorb the difference in thermal expansion between the ceramic body and base plate, thereby preventing the ceramic body from being broken down if sudden temperature change occurs.

Besides, the indium or indium alloy is high in thermal conductivity, and if heat is applied to the attraction object, it can be cooled uniformly and quickly. Hence, when applied in the semiconductor manufacturing process, plasma of high electric power can be used, and the process speed is increased, the pattern is made fine, and the wafer diameter can be increased. Moreover, since the uniform heating performance of the wafer can be enhanced, the yield of IC chip can be improved, so that the wafer support member having many features can be presented.

An embodiment of the invention is described below by reference to an illustrated example of the wafer support member.

Figure 4:
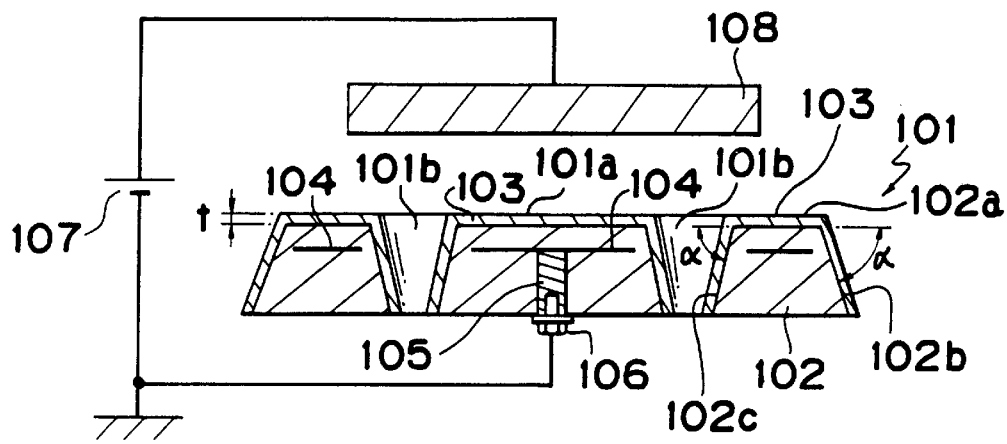
FIG. 4 is a longitudinal sectional view showing a wafer support member as an example of attraction device of the invention.

A wafer support member 101 shown in FIG. 4 is a disk plate, and has an attraction surface 101a for mounting an attraction object 108 such as semiconductor wafer on, and plural penetration holes 101*b* such as pin hole for moving the attracted object 108 or gas holes for injecting helium gas for uniform heating. The wafer support member 101 is composed of a base body 102, and an aluminum nitride film 103 provided an the surface thereof.

In the base body 102, an internal electrode 104 is buried in ceramics such as alumina and aluminum nitride, and an electrode take-out portion 105 and a power feeding terminal 106 of the internal electrode 104 are provided on the bottom side. Meanwhile, in the base body 102, the angle α formed by a flat surface 102*a* forming the attraction surface 101*a* with the outer circumference 102*b* and penetration hole inner wall 102*c* is respectively 80° or less. That is, the outer circumference 102*b* and penetration hole inner wall 102*c* are formed in an upward taper. Accordingly, in a step of forming the aluminum nitride film 103 mentioned later, the aluminum nitride film 103 in a sufficient thickness can be formed also on the outer circumference 102*b* and penetration hole inner wall 102*c*.

Herein, the angle α is defined to be 80° or less because, if exceeding 80°, the outer circumference 102*b* and penetration hole inner wall 102*c* become closer to vertical planes and the aluminum nitride film 103 cannot be formed in a sufficient thickness. However, if the angle is too small, processing is not economical and the substantial attraction surface 101*a* becomes smaller, and hence the angle α should be more than 30°.

To form the penetration hole inner wall 102*c* at an angle α to the bases body 102, a grindstone in a shape matching the penetration hole is prepared, and the inner circumference of the preliminarily formed penetration hole is processed and finished by the grindstone in this shape.

The aluminum nitride film 103 covers the flat surface 102*a*, outer circumference 102*b*, and penetration hole inner wall 102*c* of the base body 102, and is formed on the tire surface except the bottom.

This aluminum nitride film 103 can be formed by known vapor phase growth method, for example, PVD method such as sputtering and ion plating, and CVD method such as plasma CVD, Mo CVD, and thermal CVD. At this time, aluminum nitride particles are applied along the flow of gas in the perpendicular direction to form a film, and since the outer circumference 102*b* and penetration hole inner wall 102*c* of the base body 102 are tapered upward, aluminum nitride particles are applied also favorably on these surfaces, and the aluminum nitride film 103 of a sufficient thickness can be formed.

The aluminum nitride film 103 obtained by this vapor phase growth method has a purity of aluminum nitride of over 99%, and the plasma resistance is extremely high. Hence, in the wafer support member 101 of the invention, since the surface is covered with the aluminum nitride film 103 of sufficient thickness and high purity, the excellent plasma resistance can be maintained for a long period. Still more, since the attraction surface 101*a* is made of aluminum nitride film 103 of high purity, adverse effects on the attraction object 108 such as semiconductor wafer can be prevented. In addition, since the aluminum nitride layer 103 is high in thermal conductivity, radiation can be improved.

The film thickness t of the attraction surface 101*a* of the aluminum nitride film 103 is preferably in a range of 0.01 to 0.5 mm, and more preferably 0.2 to 0.4 mm. That is, if the film thickness t is less than 0.01 mm, the effect for maintaining the plasma resistance over a long period is poor, and the anti-voltage becomes smaller and dielectric breakdown is likely to occur, or if the film thickness t exceeds 0.5 mm, to the contrary, the forming time of aluminum nitride film 103 becomes long, and the productivity is poor.

Thus, the aluminum nitride film 103 is thin, and therefore the angle of the attraction surface 101*a* after being covered with the aluminum nitride film 103 formed with the outer circumference and penetration hole inner wall is nearly same as the angle α in the base body 102.

By placing the attraction object 108 on the attraction surface 101*a* of such wafer support member 101 of the invention, and applying a direct-current high voltage of about 1000 V from the power source 107 between the power feeding terminal 106 and attraction object 108, the attraction object 108 can be attracted electrostatically.

The example in FIG. 4 shows a single-pole type structure having one internal electrode 104 in the wafer support member 101, but a twin-pole type structure may be also constituted by using plural internal electrodes so as to feed power to these internal electrodes.

Incidentally, by incorporating a resistance heating element inside the base body 102 for forming the wafer support member 101, high temperature heating is realized, and heating of the wafer or other attraction object 108 can be controlled. Similarly, by incorporating a plasma generating electrode in the base body 102, plasma can be generated by applying a high frequency electric power.

Figure 5:
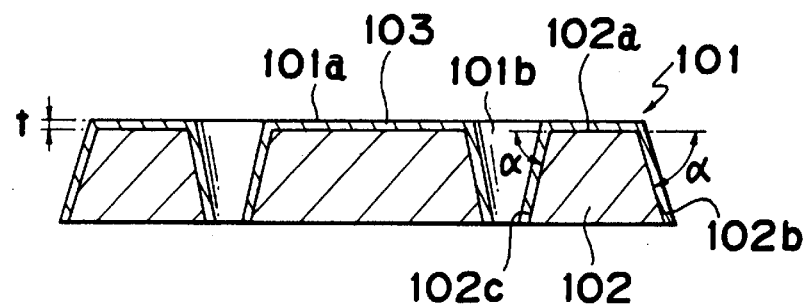
FIG. 5 is a longitudinal sectional view showing a wafer support member in other embodiment of attraction device of the invention.

In other embodiment, as shown in FIG. 5, the base body 102 is formed of metal or conductive ceramics or other conductive material, and an aluminum nitride film 103 is formed on the flat surface 102*a*, outer circumference 102*b*, and penetration hole inner wall 102*c*, thereby composing a wafer support member 101. In this case, the base body 102 also serves as internal electrode, and by feeding power between the base body 102 and the attraction object (not shown), it can act as single-pole type wafer support member.

In this case, too, same as in the example shown in FIG. 4, by defining the angle α formed by the flat surface 102*a* of the base body 102 with the outer circumference 102*b* and penetration hole inner wall 102*c* at 80° or less, the aluminum nitride film 103 of sufficient thickness can be also formed on these surfaces. The film thickness t of the aluminum nitride film 103 on the attraction surface 101*a* is preferably in a range of 0.01 to 0.5 mm, and more preferably 0.2 to 0.4 mm.

Figure 6A:
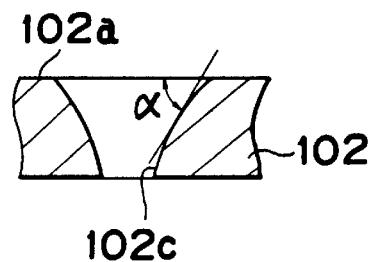
FIGS. 6(a) and (b) are sectional views showing other embodiment of penetration hole part of base body.
Figure 6B:
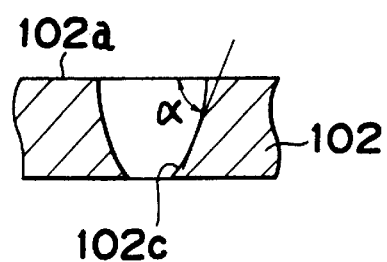

As other mode of the outer circumference 102*b* or penetration hole inner wall 102*c* in the base body 102, the section may be formed in a curvature as shown in FIG. 6, and in this case the angle α formed by the tangent to the curve and the flat surface 102*a* is defined to be 80° or less.

A different embodiment of the invention is described below.

Figure 7:
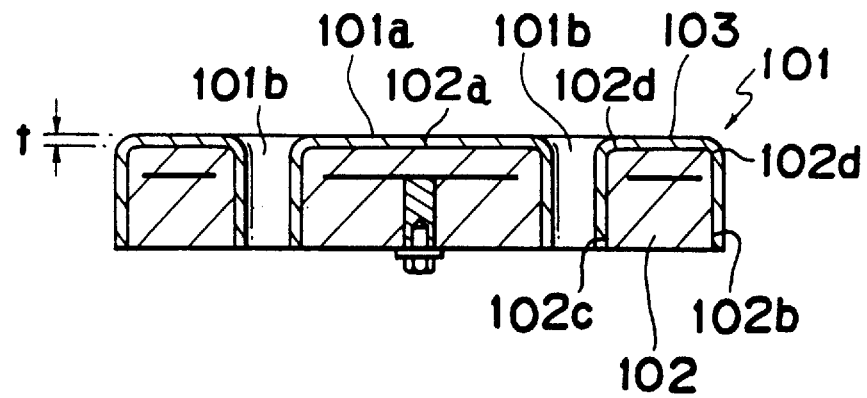
FIG. 7 is a longitudinal sectional view showing a wafer support member in a different embodiment of attraction device of the invention.

In a wafer support member 101 shown in FIG. 7, the outer circumference 102*b* and penetration hole inner wall 102*c* of the base body 102 are vertical planes, and a chamfer 102*d* is formed in the boundary with each flat surface 102*a*.

Accordingly, when forming the aluminum nitride film 103 by vapor phase growth method, the gas flow in the perpendicular direction is reduced by the chamfer 102*d*, and is suppressed to the outer circumference 102*b* and penetration hole inner wall 102*c* to form the film, so that the aluminum nitride film 103 can be favorably formed also on the outer circumference 102*b* and penetration hole inner wall 102*c*.

Moreover, by forming the chamfer 102*d*, when conveying the wafer support member 101, if colliding against other member, it is hardly damaged, and peeling of the aluminum nitride film 103 at the edge of the attraction surface can be prevented.

Figure 8:
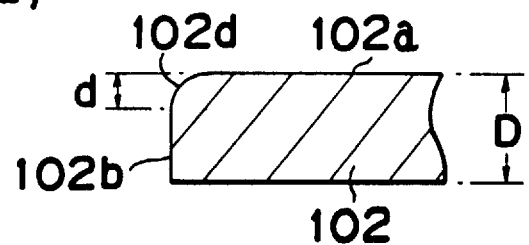
FIGS. 8(a) and (b) are sectional views showing an embodiment of outer circumferential part of base body.
Figure 8:
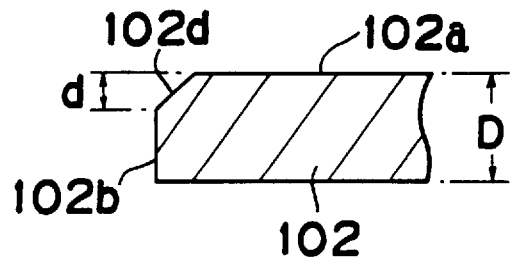

Besides, as the shape of the chamfer 102d, various shapes may be formed, for example, R-form as shown in FIG. 8(a) and C-form as shown in FIG. 8(b), and anyway the width d of the chamfer 102d to the overall thickness D of the base body 102 is 1/16. This is because if the width d of the chamfer 102d to the overall thickness D of the base body 102 is less than 1/16, the aluminum nitride film 103 of sufficient thickness cannot be formed on the outer circumference 102b and penetration hole inner wall 102c.

Such chamfer 102d can be formed by cutting and processing before sintering, or processing by using a grindstone of specified shape after sintering.

In the example in FIG. 7, meanwhile, all other parts are same as in the example in FIG. 4. That is, the base body 102 has the internal electrode 104 buried in ceramics such as alumina and aluminum nitride, and has the electrode take-out portion 105 and power feeding terminal 106 for connecting thereto provided at the bottom side, and by feeding power between the power feeding terminal 106 and attraction object (not shown), the attraction object can be electrostatically attracted on the attract ion surface 101a. A twin-pole type structure can be also constructed by forming plural internal electrodes 104.

Moreover, by forming the base body 102 itself of metal, or conductive ceramics or conductive material, it can also serve as internal electrode.

The aluminum nitride film 103 is formed by vapor phase growth method, and the film thickness t on the attraction surface 101a may be in a range of 0.01 to 0.5 mm, preferably 0.2 to 0.4 mm.

As a further different embodiment of the invention, as shown in FIG. 4, the angle $\alpha$ formed by the outer circumference 102b and penetration hole inner wall 102c with the flat surface 102a is defined at 80° or less, and the chamfer 102d as shown in FIG. 7 may be also formed.

The foregoing embodiments relate to the wafer support member only, but the invention may be also applied to the vacuum chuck.

That is, the base body having plural penetration holes for vacuum suction is formed of ceramics, the angle formed by the outer circumference and penetration hole inner wall and the flat surface is 80° or less, or a chamfer is formed in the boundary of the outer circumference and penetration hole inner wall with the flat surface, and an aluminum nitride film is formed on the outer circumference, penetration hole inner wall, chamfer, and flat surface, thereby composing a vacuum chuck. In this vacuum chuck, since the attraction surface is made of aluminum nitride film of high purity, adverse effects are hardly caused on the attraction object, and thermal conductivity is high, so that the radiation may be improved.

Embodiment 1

Herein, as an embodiment of the invention, the wafer support member 101 shown in FIG. 4 and FIG. 5 was fabricated, and its effect was investigated by experiment.

First, after obtaining slurry by adding and blending forming aid and solvent in aluminum nitride powder, plural green sheets in a thickness of 0.5 mm were formed by doctor blade method, and tungsten powder and aluminum nitride powder were mixed in one of them to adjust the viscosity, and a resistance paste was screen printed, and the internal electrode 104 was formed.

Consequently, plural green sheets were laminated on the resistance heating element, and thermally compressed with a pressure of 50 kg/cm² at 80° C., and then cut and processed into a disk plate, and it was degreased in vacuum, and reduced and sintered at temperature of about 2000° C., thereby obtaining a base body 102 made of aluminum nitride ceramics of thermal conductivity of 100 W/m·k, volume resistivity of $10^{13}$ Ω·cm, outside diameter of about 8 inches, and thickness of 10 mm.

Separately, a base body 102 made of molybdenum with volume resistivity of $10^{-3}$ Ω·cm, outside diameter of about 8 inches, and thickness of 10 mm was also fabricated.

Other samples were fabricated by varying the angle $\alpha$ of the outer circumference 102b and penetration hole inner wall 102c to the flat surface 102a of these base bodies 102.

On the base body, in consequence, an aluminum nitride film 103 was formed by thermal CVD method. Using aluminum chloride and ammonia, and hydrogen and nitrogen as reaction gas, the aluminum nitride film 103 was formed at temperature of 800° to 1000° C. and at reduced pressure of about 50 Torr.

The film thickness of the formed aluminum nitride film 103 can be finished to a desired dimension by controlling the film forming time, and films of various thicknesses were fabricated.

Among them, first, using molybdenum as the base body 102, the aluminum nitride films 103 of various film thicknesses were prepared as insulating films.

In the wafer support member 101 in the structure shown in FIG. 5, directcurrent voltage 1000 V was applied to attract the silicon wafer, and the attracting force was measured.

The results are shown in Table 5. As known from the results, insulation was easily broken down in the film thickness t of the aluminum nitride film 103 on the attraction surface 101a of 0.005 mm or less. By contrast, at the film thickness t of 0.01 mm or more, stable attraction was enabled without insulation breakdown. However, if the film thickness t exceeds 0.5 mm, the forming time of aluminum nitride film 103 was longer, and the productivity was impaired.

The attracting force is also related with the film thickness, and a nearly constant attracting force was obtained in the film thickness t range of 0.2 to 0.4 mm, and it was found to be easy to handle as wafer support member.

A similar tendency was noted in the wafer support member in the structure in FIG. 4, using aluminum nitride ceramics as the base body 102.

Hence, the film thickness t of the aluminum nitride film 103 on the attraction surface 101a is preferred to be in a range of 0.01 to 0.5 mm, and more preferably 0.2 to 0.4 mm.

Similar results were obtained by using metal material such as tungsten and Kovar or alumina ceramics having internal electrode as the base body 102 of the wafer support member 101.

TABLE 5

| Film thickness t (mm) | Anti-voltage at 1 kV | Attraction force (g/cm²) |
|---|---|---|
| 0.005 | x (breakdown) | — |
| 0.01 | ○ | 220 |
| 0.1 | ○ | 190 |
| 0.2 | ○ | 120 |
| 0.5 | ○ | 115 |
| 0.5 | ○ | 60 |

Next, as the wafer support member 101 in the structure shown in FIG. 4, an aluminum nitride film 103 in a film thickness t of 0.01 mm was formed on a flat surface 102a of a base body 102 made of aluminum nitride ceramics, and the angle α of the outer circumference 102b and penetration hole inner wall 102c was varied, and the samples were incorporated in plasma generated device for experiment.

In a chamber evacuated to about 10 Torr, a power source of 1 kW at 13.56 kHz was connected to the plasma generating electrode set parallel to the wafer support member 101, and the wafer support member surface was etched directly.

As a result, as shown in Table 6, in the case of the angle α formed by the outer circumference 102b and penetration hole inner wall 102c of the base body 102 with the flat surface 102a tapered to 80° or less, a sufficiently thick aluminum nitride film 103 could be formed on these surfaces, and a sufficient plasma resistance to the target direct plasma exposure time of 1000 hours was confirmed.

TABLE 6

| Angle α of outer circumference and penetration hole inner wall of base body with flat surface | Plasma resistance | Judgement |
|---|---|---|
| 90° (vertical) | Base body exposed in 5 hours | X |
| 85° | Base body exposed in 98 hours | X |
| 90° | No abnormality after 1000 hours | ○ |
| 75° | No abnormality after 1000 hours | ○ |
| 70° | No abnormality after 1000 hours | ○ |
| 45° | No abnormality after 1000 hours | ○ |

Wafer support members with the film thickness t of the alumina nitride film 103 on the flat surface 102a of the base body 102 of 0.01 mm or more were incorporated in similar plasma generating apparatus and presented for experiment.

As a result, in the case of the angle α of the outer circumference 102b and penetration hole inner wall 102c of the base body 102 with the flat surface 102a of over 80°, the base body 102 was exposed by plasma injection for less than 1000 hours, whereas in the case of the angle α of less than 80°, a sufficient plasma resistance over 1000 hours was confirmed.

It is hence judged to be preferable to define the angle α of the outer circumference 102b and penetration hole inner wall 102c of the base body 102 with the flat surface 102a at 80° or less, and the film thickness t of the aluminum nitride film 103 on the attraction surface 101a at 0.01 mm or more.

A similar experiment was conducted by changing the material of the base body 102 of the wafer support member 101 to alumina ceramics containing internal electrode, or tungsten, molybdenum or Kovar, and exactly the same results were obtained.

Embodiment 2

Same as in embodiment 1, a base body 102 composed of aluminum nitride ceramics comprising an internal electrode 4 was fabricated, and various chamfers 102d were formed at the boundary of the outer circumference 102b and penetration hole inner wall 102c with the flat surface 102a.

In these base bodies 102, same as in embodiment 1, aluminum nitride films 103 were formed, and the film thickness t on the attraction surface 101a was defined at 0.01 mm, and the samples were incorporated in the plasma generating apparatus for experiment.

In a chamber evacuated to about 10 Torr, a power source of 1 kW at 13.56 MHz was connected to the plasma generating electrode set parallel to the wafer support member 101, and the wafer support member surface was directly etched.

As a result, as shown in Table 7, at the width d of the chamfer 102d at less than 1/16 to the overall thickness D of the base body 102, the base body 102 was exposed by plasma irradiation for less than 1000 hours, whereas the samples of 1/16 or more proved to have a sufficient plasma resistance for more than 1000 hours.

TABLE 7

| Base body thickness D | Chamfer shape and width d | Base body thickness ratio d/D | Plasma resistance | Judgement |
|---|---|---|---|---|
| 8 mm | R-form 0.3 mm | 0.6/16 | Base body exposed in 17 hours | X |
| 8 mm | R-form 0.4 mm | 0.8/16 | Base body exposed in 94 hours | X |
| 8 mm | C-form 0.4 mm | 0.8/16 | Base body exposed in 200 hours | X |
| 8 mm | R-form 0.5 mm | 1/16 | No abnormality after 1000 hours | ○ |
| 8 mm | C-form 0.5 mm | 1/16 | No abnormality after 1000 hours | ○ |
| 8 mm | C-form 1.0 mm | 2/16 | No abnormality after 1000 hours | ○ |
| 4 mm | R-form 0.1 mm | 0.4/16 | Base body exposed in 8 hours | X |
| 4 mm | R-form 0.2 mm | 0.8/16 | Base body exposed in 86 hours | X |
| 4 mm | C-form 0.2 mm | 0.8/16 | Base body exposed in 200 hours | X |
| 4 mm | R-form 0.3 mm | 1.2/16 | No abnormality after 1000 hours | ○ |
| 4 mm | C-form 0.3 mm | 1.2/16 | No abnormality after 1000 hours | ○ |
| 4 mm | C-form 0.5 mm | 2/16 | No abnormality after 1000 hours | ○ |
| 12 mm | R-form 0.3 mm | 0.4/16 | Base body exposed in 9 hours | X |
| 12 mm | R-form 0.6 mm | 0.8/16 | Base body exposed in 82 hours | X |
| 12 mm | C-form 0.6 mm | 0.8/16 | Base body exposed in 200 hours | X |
| 12 mm | R-form 0.8 mm | 1.1/16 | No abnormality after 1000 hours | ○ |
| 12 mm | C-form 0.8 mm | 1.1/16 | No abnormality after 1000 hours | ○ |
| 12 mm | C-form 1.5 mm | 2/16 | No abnormality after 1000 hours | ○ |

On the other hand, a similar experiment was conducted by changing the material of the base body 102 of the wafer support member 101 to alumina ceramics containing internal electrode, or tungsten, molybdenum, Kovar or other metal, and exactly the same results were obtained.

Thus, according to the invention, the base body having penetration holes opening in a flat surface forming the attraction surface is formed of metal or ceramics, and the angle formed by the outer circumference and penetration hole inner wall of the base body with the flat surface is 80° or less, and the flat surface, outer circumference, and inner wall of penetration holes are covered with aluminum nitride film, thereby composing an attraction device, so that a sufficiently thick aluminum nitride film can be formed also on the outer circumference and penetration hole inner wall of the base body. As a result, an aluminum nitride film of high purity can be formed on all surface except the bottom, and an excellent plasma resistance is maintained for a long period, and a wafer support member of high performance excellent in heat release property is obtained without any adverse effect on the attraction object such as semiconductor wafer.

According to the invention, moreover, the base body having penetration holes opening in a flat surface forming the attraction surface is formed of metal or ceramics, chamfers are formed in the boundary of the outer circumference and penetration hole inner wall of the base body with the flat surface, and the flat surface, outer circumference, and inner wall of penetration holes are covered with aluminum nitride film, thereby composing an attraction device, so that a sufficiently thick aluminum nitride film can be formed also on the outer circumference and penetration hole inner wall of the base body. As a result, an aluminum nitride film of high purity can be formed on all surface except the bottom, and an excellent plasma resistance is maintained for a long period, and the heat release property is excellent without any adverse effect on the attraction object such as semiconductor wafer. Still more, it is hardly broken if colliding in the conveying process, and the aluminum nitride film in the edge of the attraction surface is hardly peeled, and the wafer support member of high performance is obtained.

An embodiment of the invention is described below by reference to drawings.

Figure 9:
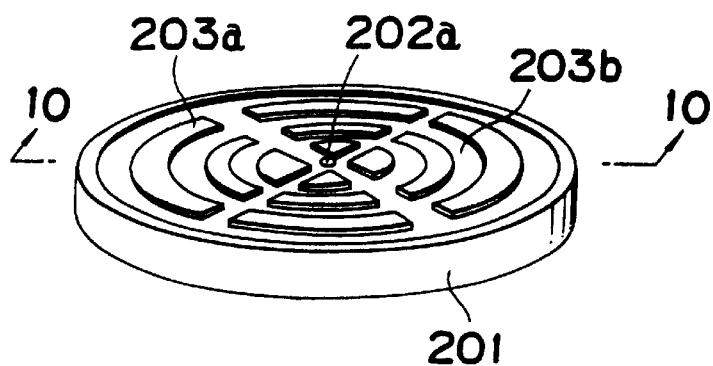
FIG. 9 is a perspective view showing a wafer support member of the invention.
Figure 10:
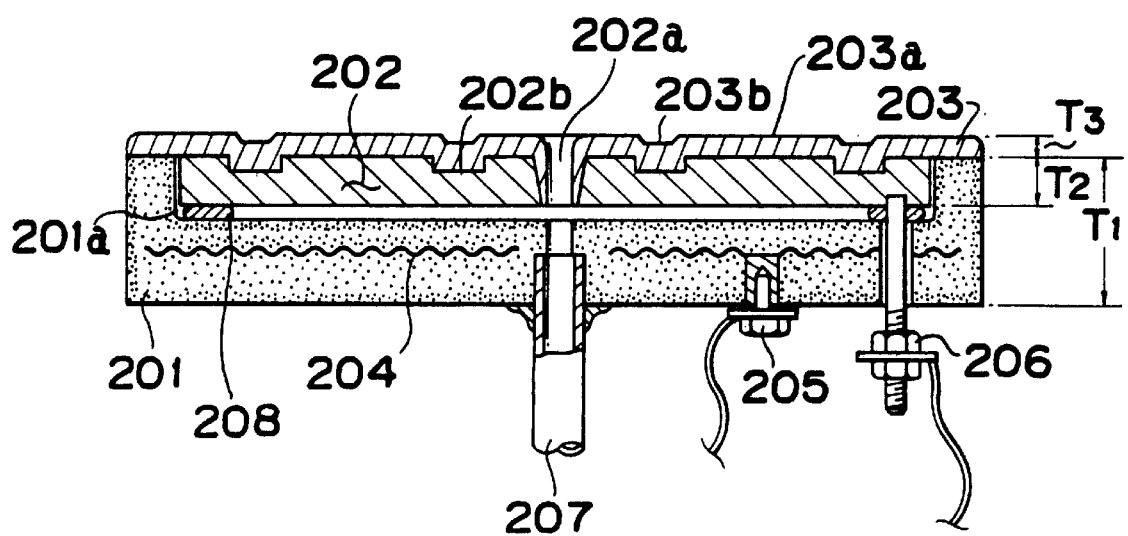
FIG. 10 is a sectional view along line X—X in FIG. 9.

As shown in a perspective view in FIG. 9 and a sectional view in FIG. 10, the wafer support member of the invention is constituted by disposing a metallic electrode plate 202 on a recess 201a formed on the top of a ceramic base body 201, and coating the surface of the electrode plate 202 with an aluminum nitride film 203, thereby forming an attraction surface 203a. The electrode plate 202 serves as an electrostatic attraction electrode, and by feeding power to this electrode plate 202, the attraction object such as silicon wafer is attracted to the attraction surface 203a on the aluminum nitride film 203.

The material of the base body 201 is ceramics with volume resistivity of $10^{10}$ Ω·cm or more and thermal conductivity of 20 W/m·K or more, and this is because an electric insulation is required for directly bonding the electrode plate 202 and superior uniform heating is needed for processing the silicon wafer at high precision. As the material satisfying all these requirements, ceramics mainly composed of aluminum nitride or alumina are used. More preferably, ceramics mainly composed of aluminum nitride higher in thermal conductivity, superior in uniform heating performance, and higher in stability against plasma should be selected.

The thickness $T_1$ of this base body 201 should be 3 mm or more to withstand the stress for bonding the electrode plate 202 mentioned later, and in order to form the recess 201a for disposing the electrode plate 202, the thickness $T_1$ of the base body 201 should be greater than the thickness $T_2$ of the electrode plate 202.

Inside the base body 201, a resistance heating element 204 is buried, and a power feeding terminal 205 is provided for feeding power thereto. For example, the coefficient of thermal expansion of the aluminum nitride ceramics for composing the base body 201 is $5\times10^{-6}$/° C., and hence the material for the resistance heating element 204 should be tungsten or other metal having a thermal expansion of 4 to $6\times10^{-6}$/° C., similar to that of the base body 201, and more preferably traces of aluminum nitride component should be added to such metal to enhance the contact tightness with the base body 201. Moreover, by defining the thickness of the resistance heating element 204 to 30 μm or less, effects of difference in thermal expansion from the base body 201 can be minimized.

By feeding power to the resistance heating element 204, the ceramic base body 201 can be held to a desired temperature.

The base body 201 comprises a power feeding terminal 206 to the electrode plate 202 and a pipe 207 for feeding gas.

On the other hand, the electrode plate 202 is made of a metal of which coefficient of thermal expansion is 4 to $6\times10^{-6}$/° C., such as tungsten, molybdenum and Kovar, and has a penetration hole 202a in the center and a groove 202b on the top surface. As the electrode plate 202 is energized from the power feeding terminal 206, it acts not only as the electrostatic attraction electrode, but also as plasma generating electrode. So as not to be broken by application of high voltage for plasma generation, the thickness $T_2$ of the electrode plate 202 is 0.5 mm or more.

As the bonding structure of the electrode plate 202 and ceramic base body 201, the electrode plate 202 is fitted into the recess 201a formed in the base body 201, and the lower surface of the electrode plate 202 is partly bonded through a metalized part. Instead of the metalized part, it may be bonded mechanically by using screws or the like.

In this way, by using a material similar in coefficient of thermal expansion to that of the base body 201 as the material for the electrode plate 202, and by bonding the base body 201 and electrode plate 202 partly, instead of bonding entirely, the difference in coefficient of thermal expansion of the two can be alleviated.

The structure of fitting the electrode plate 202 into the recess 201a of the base body 201 is intended to prevent exposure of the electrode plate 202 into the semiconductor manufacturing apparatus, which may lead to abnormal discharge by plasma.

From the pipe 207 provided in the lower part of the base body 201, helium or argon gas can be introduced, and the gas is led into the gap in the junction between the base body 201 and electrode plate 202, thereby enhancing the thermal conductivity between the two. Moreover, the gas is further guided into the spacing between the attraction surface 203a and the attraction object such as silicon wafer through the penetration hole 202a, and the mutual heat transfer rate is extremely heightened, so that the temperature of the base body 201 can be effectively transmitted to the attraction object such as silicon wafer. Meanwhile, since the groove 202b is formed on the top surface of the electrode plate 202, a groove 203b is also formed in the attraction surface 203a after forming the aluminum nitride film 203, and the gas is led into this groove 203b, thereby enhancing the heat transfer further.

On the other hand, on the top surface of the electrode plate 202 and peripheral top surface of the base body 201, an aluminum nitride film 203 is formed, and the aluminum nitride film 203 can be formed in known vapor phase growth method, for example, PVD method such as sputtering and ion plating, or PVC method such as plasma CVD, Mo CVD and thermal CVD. Such aluminum nitride film 203 as an aluminum nitride purity of over 99%, but oxygen may be possibly contained in the process of film forming. If the oxygen content is too high, adhesion with the metal plate 202 may be lowered, and it is hence desired to control the oxygen content in the aluminum nitride film 203 under 20% by atom.

The thickness $T_3$ of aluminum nitride film 203 is in a range of 0.01 to 0.5 mm, and preferably 0.2 to 0.4 mm. That is, if the thickness is less than 0.01 mm, the anti-voltage is smaller and insulation breakdown may occur and the durability is worse, or in the case of $T_3$ exceeding 0.5 mm, it takes a longer time to form the aluminum nitride film 203, and the productivity is inferior.

The operation of the wafer support member is described below.

Figure 11:
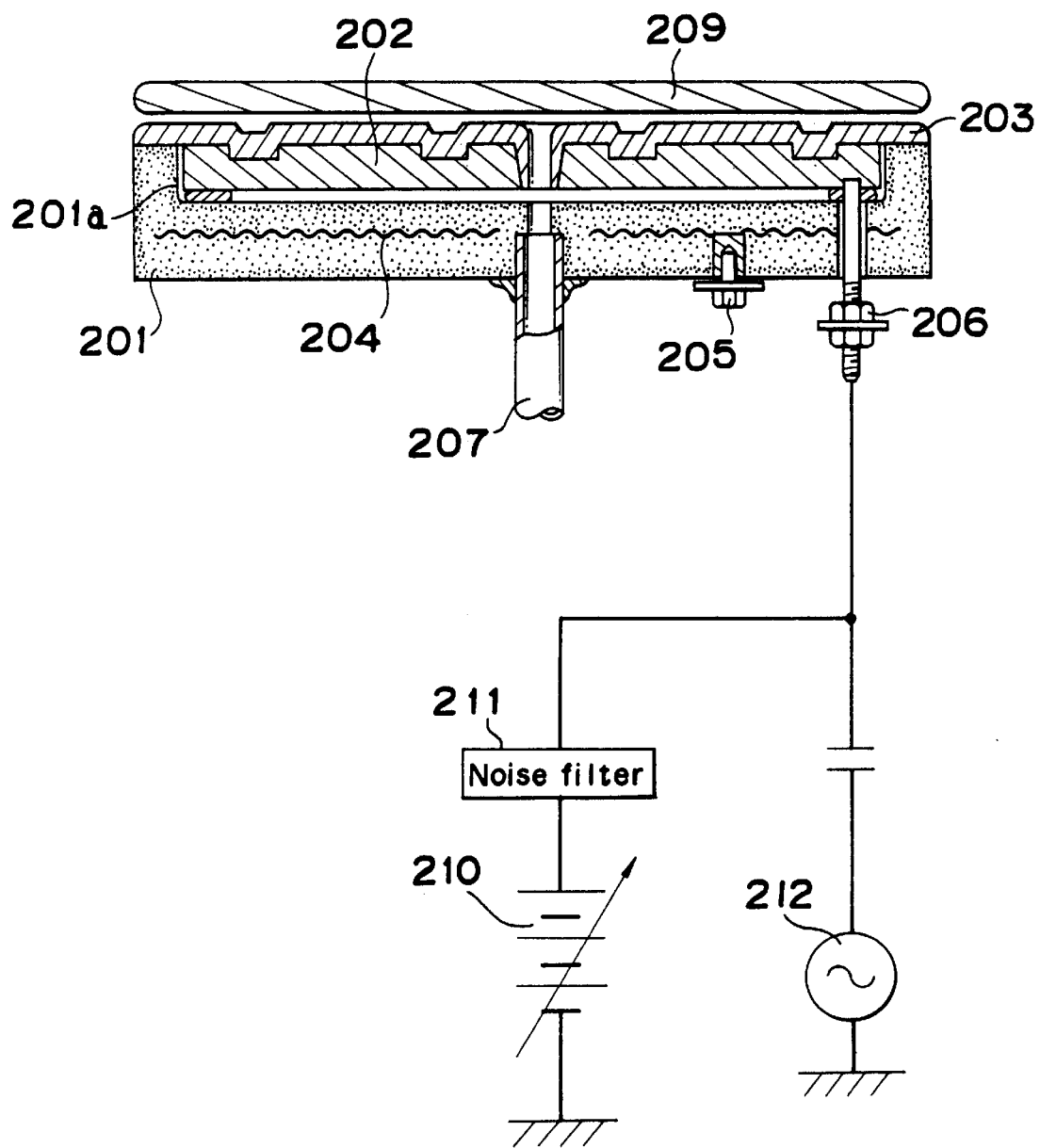
FIG. 11 is a wiring diagram of wafer support member of the invention.

As shown in FIG. 11, when a direct-current high voltage of about 1000 V is applied from an electrostatic attraction power source 210 to the power feeding terminal 206 for feeding power to the electrode plate 202, the aluminum nitride film 203 functions as insulating layer, and the attraction object 209 such as silicon wafer can be electrostatically attracted to the attraction surface 203a.

Through the power feeding terminal 206, a high frequency voltage can be also applied to the electrode plate 202 from a plasma generating power source 212, and by setting a wafer support member in the vacuum apparatus, plasma can be generated. At this time, the electrode plate 202 is a single metal plate having a sufficient thickness $T_2$ of 0.5 mm or more, and if such high frequency voltage is applied, it will not be heated or burnt down.

If both direct-current high voltage of the electrostatic attraction power source 210 and high frequency voltage of the plasma generating power source 212 are applied to the electrode plate 202, a filter 211 for cutting high frequency should be placed between the electrostatic attraction power source 210 and power feeding terminal 206.

The aluminum nitride film 203 is high in purity and excellent in plasma resistance, and hence it has a long life without causing adverse effects on the attraction object 209 on the attraction surface 203a.

Incidentally, as the resistance heating element 204 provided in the ceramic base body 201, only one layer of band thin film pattern in a thickness of 30 microns or less is buried, and hence, same as in general ceramic heater, an extremely high reliability can be obtained.

Embodiment 3

Wafer support members of the invention shown in FIGS. 9 and 10 were actually fabricated, and evaluated in experiment.

After obtaining slurry by adding and mixing forming aid and solvent toe aluminum nitride powder, plural green sheets of 0.5 mm in thickness were formed by doctor blade method, and a resistance paste adjusted in viscosity by mixing tungsten powder and aluminum nitride powder was screen printing on one of them, and a resistance heating element 204 was formed.

The plural green sheets were laminated on the resistance heating element 204, and thermally compressed with a pressure of 50 kg/cm$^2$ at 80° C., and were cut and processed to a disk plate, which was dewaxed and reduced and sintered at temperature of about 2000° C., thereby obtaining a base body 201 of aluminum nitride ceramics with thermal conductivity of 100 W/m·K, volume resistivity of $10^{13}$ Ω·cm, outside diameter of about 8 inches, and thickness $T_1$ of 10 mm.

Besides, by other known techniques suited to ceramics, base bodies were prepared by using various ceramics such as high purity alumina with purity of 99%, silicon nitride, and silicon carbide as shown in Table 8.

For example, the alumina and silicon nitride were fabricated by doctor blade method, and silicon carbide by hot press method, and anyway the theoretical material density of the obtained base bodies was over 98%. The print pattern of resistance heating element 204 was identical in all samples, and the resistance value was 5 Ω, and the thickness was 30 μm or less.

To the resistance heating element 204 of the base body 201 thus obtained, in a first experiment, a voltage of 100 V was applied to heat to 400° C. Later, the surface temperature distribution of the base body 201 was confirmed by a temperature image processing apparatus, and it was found that the temperature distribution of the base body 201 made of silicon nitride was extremely poor and could not withstand practical use. As known from the result, the thermal conductivity of the base body 201 is required to be 20 W/m·K or more.

Next, an electrode plate 202 made of molybdenum in a thickness $T_2$ of 3 mm was prepared, and was partly tightened by bolt to each ceramic base body 201, and was presented again for heating experiment. As a result, in the electrode plate 202 tightened to the base body 201 of silicon carbide, a current leakage to the resistance heating element 204 was confirmed, and it was found that the insulation could not be assured in the base body 201 of silicon carbide. Hence, the volume resistivity of the base body 201 is required to be at least $10^{10}$ Ω·cm or more.

TABLE 8

|  | Thermal conductivity (W/mk) | Volume resistivity (Ω · cm) RT | Temperature distribution (°C.) |
| --- | --- | --- | --- |
| Aluminum nitride | 100 | $10^{13}$ | 5 |
| Alumina | 21 | $10^{16}$ | 15 |
| Silicon nitride | 14 | $10^{16}$ | 22 |
| Silicon carbide | 55 | $10^{8}$ | 9 |

Embodiment 4

In the above experiment, the thickness $T_1$ of the ceramic base body 201 was specified at 10 mm, and in this experiment it was attempted to vary the thickness $T_1$ of the base body 201 and thickness $T_2$ of electrode plate 202.

Molybdenum-made electrode plates 202 with diameter of 200 mm at various values of thickness $T_2$ were prepared, a recess 201a in the same size as the electrodes 202 was formed on the top of the base body 201 of aluminum nitride of 210 mm at various values of thickness $T_1$, and the electrode plate 202 was buried in the recess 201a.

Only on the outer circumference of the electrode plate 202, powder paste of at least one kind of titanium, copper and silver was applied, and by heating up to 1000° C. in vacuum, it was partly metalized and bonded with the base body 201.

As a result, at the thickness $T_1$ of the ceramic base body 201 of less than 3 mm, the base body 201 was warped by metalizing, and cracks were formed, and normal bonding was not possible. At the thickness $T_1$ of the base body 201 of over 3 mm, however, a favorable bond was obtained without causing warp or the like. On the other hand, at the thickness $T_2$ of electrode plate 202 of less than 0.5 mm, it was not only hard to handle, but also poor in surface precision such as flatness, and it could not withstand practical use.

Therefore, the thickness $T_1$ of the base body 201 is required to be 3 mm or more, and thickness $T_2$ of the electrode 202, 0.5 mm or more.

As for the material of the electrode plate 202, results were same in tungsten or Kovar, as well as in molybdenum. As for the material of the base body 201, results were similar in both alumina and aluminum nitride.

Incidentally, when the bonding area of the ceramic base body 201 and electrode plate 202 exceeds 20% of the total contact area, it was found that a large warp was caused due to bimetal effect at the time of heating or cooling. Hence, it is preferred to bond the ceramic base body 201 and electrode plate 202 only partly, by less than 20% of the total contact area, preferably 10% or less, by metalizing or screw tightening.

Thus, samples were obtained by bonding the ceramic base body 201 and electrode plate 202.

Consequently, on the surface of the electrode plate 202 made of molybdenum, an aluminum nitride film 203 was formed by thermal CVD method. As the reaction gas, ammonium chloride, ammonia, water and nitrogen were used, and the aluminum nitride film 203 was formed at temperature of 800° to 1000° C. in vacuum of about 50 Torr. The thickness $T_3$ of the formed aluminum nitride film 203 can be finished to a desired dimension by controlling the film forming time, and films of various thicknesses $T_3$ were obtained as shown in Table 9.

In these samples, direct-current 1000 V was actually applied, and it was attempted to attract the attraction object 209 such as silicon wafer, and samples with thickness $T_3$ of 0.005 mm or less were easily broken down. By contrast, at thickness $T_3$ of 0.01 mm or more, it was possible to attract stably without causing insulation breakdown. However, at thickness $T_3$ exceeding 0.5 mm, it took a longer time in forming the aluminum nitride film 203, and the productivity was poor.

The attraction force was also related with the thickness $T_3$, and in a range of thickness $T_3$ of 0.2 to 0.4 mm, a nearly constant attraction force could be obtained, and it was found easy to handle as wafer support member.

Hence, the thickness $T_3$ of the aluminum nitride film 203 is preferred to be in a range of 0.01 to 0.5 mm, and more preferably 0.2 to 0.4 mm.

As for the material of the electrode plate 202, results were same in tungsten or Kovar, as well as in molybdenum. Similarly, results were same, of course, whether the base body 201 was made of aluminum nitride or alumina.

TABLE 9

| Thickness $T_3$ (mm) | Anti-voltage at 1 kV | Attraction force (g/cm$^2$) |
|---|---|---|
| 0.005 | X (breakdown) | — |
| 0.01 | o | 220 |
| 0.1 | o | 190 |
| 0.2 | o | 120 |
| 0.4 | o | 115 |
| 0.5 | o | 60 |

Embodiment 5

The wafer support member of the invention was incorporated actually in a plasma generating apparatus and was presented for practical test. As shown in FIG. 11, a high frequency power source of 13.56 MHz was connected as electrostatic attraction power source 210 and plasma generating power source 212 to the power feeding terminal 206 for feeding power to the electrode plate 202, and the pipe 207 provided in the lower part of the base body 201 was connected to an argon gas feed line.

First, when a direct-current voltage of 1000 V was applied from the electrostatic attraction power source 210, the attraction object 209 of silicon wafer was fixed with an attraction force of over 60 g/cm$^2$, and hence the attraction object 209 remained to be fixed when argon gas was introduced at a pressure of about 10 g/cm$^2$ from the pipe 207.

In this state, the gap between the attraction object 209 and aluminum nitride film 203, and the gap between the electrode plate 202 and base body 201 are filled with argon gas, so that a high thermal conductivity may be maintained. Accordingly, the heat of the wafer support member obtained by applying a voltage to the resistance heating element 204 is efficiently transmitted to the attraction object 209.

Herein, by feeding fluorine derivative gas into the apparatus, when a high frequency electric power of 800 W and 13.56 MHz was applied to the electrode plate 202 from the plasma generating power source 212, plasma was generated. At this time, since the electrode plate 202 is a single metal plate with a sufficient thickness $T_2$ of over 0.5 mm, it was not heated or burnt down at high frequency. Hence, it was confirmed possible to form a desired integrated circuit in the silicon wafer or the attraction object 209.

The electrode plate 202 was confirmed to function similarly whether it is made of molybdenum, tungsten or Kovar.

On the other hand, by way of comparison, an integral sintered type aluminum nitride wafer support member burying a 20 μm thick plasma generating electrode in the prior art was tested, and the moment the high frequency electric power was turned on, the plasma generating electrode was burnt down, it was impossible to continue the test further.

Thus, in the wafer support member of the invention, a metallic electrode plate with thickness of 0.5 mm or more is bonded on a base body made of ceramics with thickness of 3 mm or more, and an aluminum nitride film with thickness of 0.01 to 0.5 mm is formed on the surface of the electrode plate to form an attraction surface, and therefore the electrode plate having a sufficient thickness can be used both as electrostatic attraction electrode and as plasma generating electrode, so that it may not be heated or burnt down at high frequency.

Besides, only one layer of band thin film pattern in a thickness of 30 μm may be buried as resistance heating element for heating in the base body, and hence an extremely high reliability same as in general ceramic heater.

The base body and electrode plate are partly bonded, and helium or argon gas is introduced into the mutual junction interface, and the thermal conductivity between the base body and electrode plate can be enhanced, and the attraction object can be heated preferably.

Moreover, the aluminum nitride film excels in plasma resistance, and is hence long in life, and the aluminum nitride film formed by vapor phase growth method is high in purity, and does not have any adverse effect on the attraction object.

Therefore, the wafer support member of the invention may be preferably used in attraction and fixing of silicon wafer, especially in semiconductor manufacturing process.

An embodiment of the invention is described below by reference to drawings.

Figure 12A:
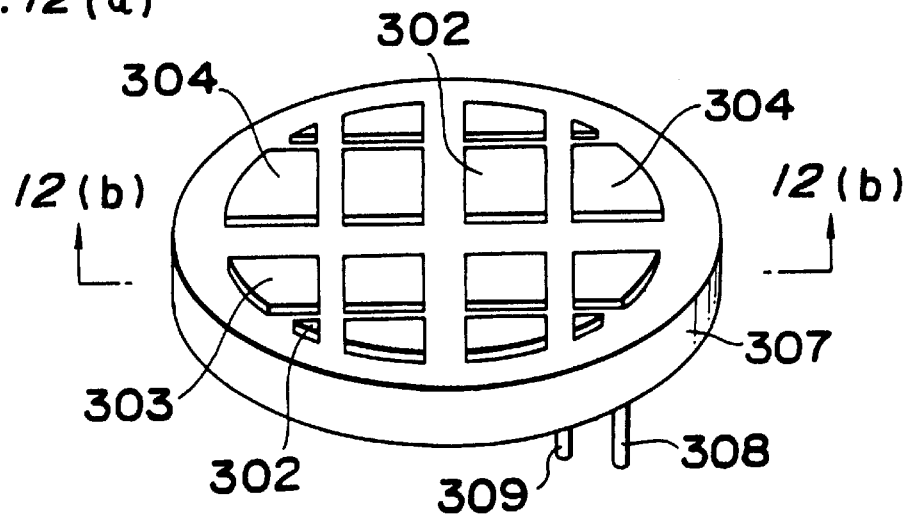
FIG. 12(a) is a perspective view showing a wafer support member of the invention, and (b) is its sectional view along line X—X.
Figure 12B:
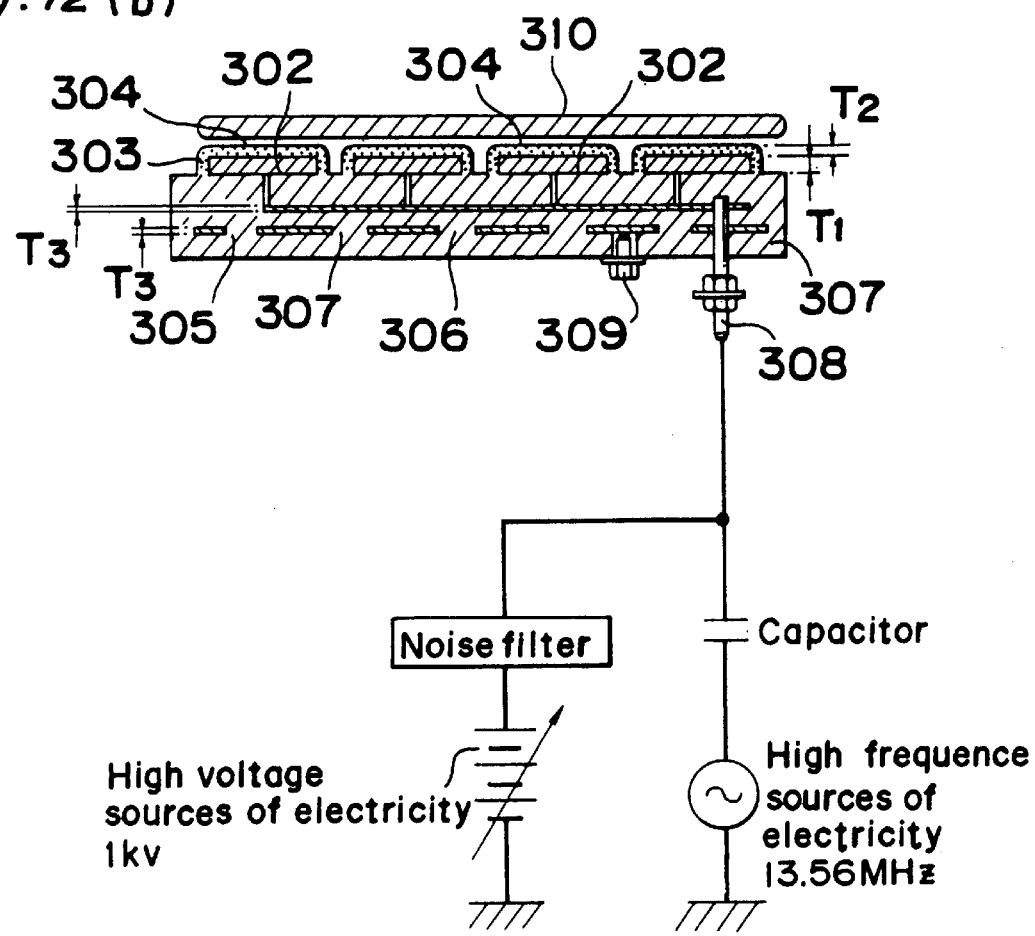

FIG. 12(a) is a perspective view of the wafer support member of the invention, and FIG. 12(b) is its sectional view along line X—X, in which the wafer support member of the invention has plural electrode portions 302 on the surface of a ceramic base body 301, and each electrode portion 302 is covered with an aluminum nitride film 303, so that the surface is used as a holding surface 304.

Figure 13:
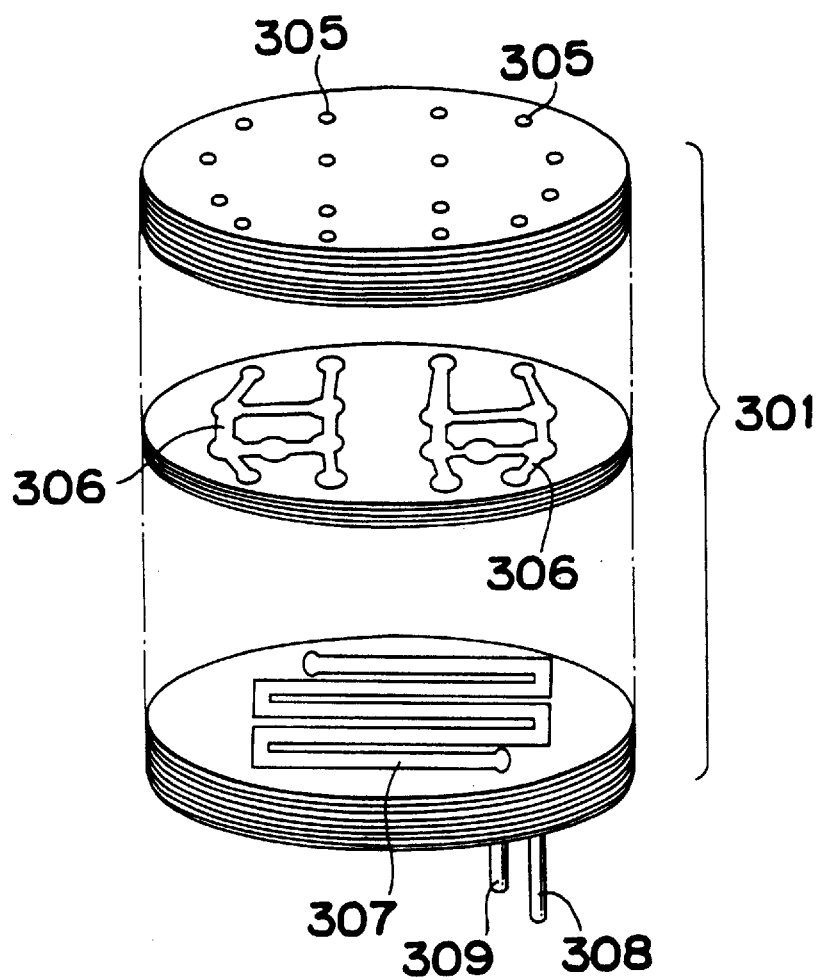
FIG. 13 is an exploded view of a ceramic base body for composing a wafer support member of the invention.

As shown in an exploded view of the ceramic base body 301 in FIG. 13, the inside of the ceramic base body 301 has two-pole conductor layers 306 for conducting via holes 305 for feeding power to plural electrodes 302, and resistance heating elements 307 for heating are buried aside from the conductor layers 306, while lead terminals 308, 309 are connected to the conductor layers 306 and resistance heating elements 307 for feeding power thereto.

Ceramics for composing the ceramic base body 301 should have volume resistivity of $10^{10}$ Ω·cm or more and thermal conductivity of 20 W/mk. This is because uniform heating performance is indispensable for forming a uniform film on the wafer 310 or processing at high precision, as well as electric insulation of the electrode portions 302.

As the ceramics having such characteristics, aluminum nitride ceramics and alumina ceramics are preferred, and more preferably aluminum nitride ceramics high in thermal conductivity, excellent in uniform heating performance, and higher in plasma resistance should be used.

However, the thickness of the ceramic base body 301 should be 3 mm or more in order to withstand the thermal stress when forming the electrode portions 302 as mentioned below.

Figure 14:
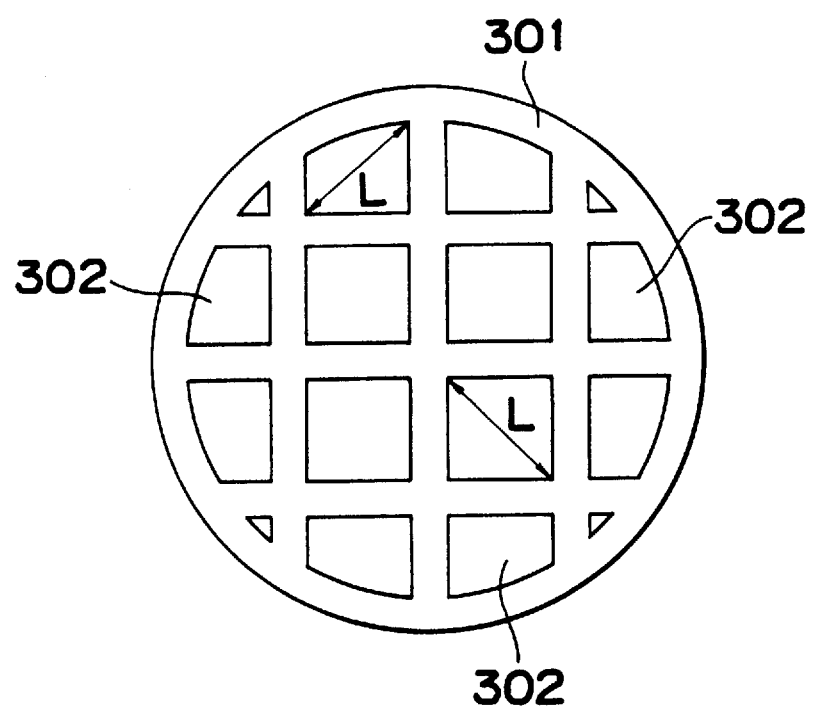
FIG. 14 is a diagram showing a pattern structure of electrode portion of a wafer support member of the invention.

The electrode portions 302 to be formed on the surface of the ceramic base body 301 are composed of plural electrode components 302 dividing the circular electrode as shown in FIG. 14 at equal intervals, and in order to attract and hold the wafer 310 uniformly, it is preferred to dispose at least the electrode portions 302 at equal intervals on the surface of the ceramic base body 301.

There is, however, a close relation between the ceramic base body 301 and the size of the electrode portions 302 formed on the surface thereof, and when the maximum length L of each electrode portion 302 is larger than 5 cm, the warp of the ceramic base body 301 due to difference in thermal expansion between the electrode portions 302 and ceramic base body 301 becomes excessive, and this warp cannot be ignored, and it may give adverse effects on the film forming precision or processing precision on the wafer 310.

It is hence necessary to define the maximum length L of each electrode portion 302 formed on the surface of the ceramic substrate 301 must not be more than 5 cm.

Herein, the maximum length of the electrode portions 302 of the invention refers to the length of the longest part in the electrode portions 302, and for example, in a circular electrode portion 302, it means its diameter, or in a quadrilateral electrode portion 302, the maximum length is the longer one of the diagonal lines.

The shape of the electrode portions 302 may be circular, elliptical, polygonal, stellar, or any other shape as far as the maximum length L is not more than 5 cm.

The thickness $T_1$ of the electrode portions 302 is also an important element. That is, since the electrode portions 302 function also as the plasma generating electrode, aside from the electrostatic attraction electrode, if thickness $T_1$ of the electrode portions 302 is less than 0.02 mm, the electrode portions 302 may be heated or burnt down when high frequency electric power is applied for generating plasma.

Therefore, the thickness $T_1$ of the electrode portions 302 must be 0.02 mm or more.

The metal for composing such electrode portions 302 may be selected from metals of which coefficient of thermal expansion is 4 to $6 \times 10^{-6}/°$ C., such as tungsten, molybdenum and Kovar. These metals are similar in the coefficient of thermal expansion (5 to $7.8 \times 10^{-6}/°$ C.) of aluminum nitride ceramics or alumina ceramics for composing the ceramic base body 301, so that warp or breakage of the ceramic base body 301 due to difference in thermal expansion can be reduced.

Moreover, in the case of the ceramic base body 301 composed of aluminum nitride ceramics, traces of aluminum nitride powder may be added to the metal, and by adding aluminum nitride powder, the difference in thermal expansion from the ceramic base body 301 may be further reduced, so that warp or breakage of the ceramic base body 301 can be further decreased.

In this way, to form the electrode portions 302 on the surface of the ceramic base body 301, the paste of the metal is applied in specified size and baked to be integrated with the ceramic base body 301, or a metalized layer is formed, and a metal plate or metal foil in specified size for forming the electrode portions 302 is bonded to the ceramic base body 301 with solder such as titanium and silver.

After forming the electrodes nearly on the whole surface of the ceramic base body 301 in the above method, it may be divided into electrode portions 302 by cutting or processing into the maximum length L of less than 5 cm.

Moreover, the electrode portions 302 on the ceramic base body 301 are coated with the aluminum nitride film 303, and this aluminum nitride film 303 may be applied by known vapor phase growth method, for example, PVD method such as sputtering method and ion plating method, CVD method such as plasma CVD method, Mo CVD method, and thermal CVD method, and other thin film forming means, and the film purity is preferred to be 99% or more, or more preferably 99.9% or more. When forming by the thin film forming means, it is possible that oxygen may be contained in the film 303, and if this oxygen content is excessive, the contact tightness with the electrode portions 302 is lowered. It is hence desired to control the oxygen content in the aluminum nitride film 303 under 20 atomic %.

The film thickness $T_2$ of the aluminum nitride film 303 is preferred to be 0.01 to 0.5 mm, and more preferably 0.05 to 0.4 mm. That is, if the film thickness $T_2$ of the aluminum nitride layer 303 is less than 0.01 mm, the anti-voltage of the film 303 is too small, and insulation breakdown occurs, and the durability is lowered. To the contrary, if the film thickness $T_2$ of the aluminum nitride film 303 is larger than 0.5 mm, it takes a longer time in forming the aluminum nitride film 303, and the productivity is inferior, and also fluctuations occur in the film thickness $T_2$ and the electrostatic attraction force drops.

Although the aluminum nitride film 303 may be applied on the entire surface of the ceramic base body 301 comprising the electrode portions 302, it is preferred to cover only the electrode portions 302. This is because the forming method differs between the ceramic base body 301 and aluminum nitride film 303, and there is a slight difference in thermal expansion between the two if the ceramic base body 301 is made of aluminum nitride ceramics, and hence it is possible to cause warp in the ceramic base body or crack in the aluminum nitride film 303.

To cover only the electrode portions 302 with aluminum nitride film 303, a mask may be placed between electrode portions 302 to cover the aluminum nitride film 303, or after once covering the entire surface of the ceramic base body 301 with aluminum nitride film 303, the aluminum nitride film 303 may be removed from between the electrode portions 302 by shot blasting or similar method.

On the other hand, in the ceramic base body 301, two-pole conductive layers 306 for feeding power to the electrode portions 302 and resistance heating elements 307 for heating are buried, and by defining the film thickness $T_3$ of these conductor layers 306 and resistance heating elements 307 under 0.03 mm, warp of the ceramic base body 301 can be suppressed. As the material for the conductor layers 306 and resistance heating elements 307, same as the material for the electrode portions 302, it is preferred to use metals of which coefficient of thermal expansion is 4 to $6 \times 10^{-6}/°$ C., such as tungsten, molybdenum and Kovar, in order to minimize the difference in thermal expansion from the ceramic base body 301 and reduce the warp of the ceramic base body 301, and it is further preferred to add traces of aluminum nitride powder to the metal.

The operation of this wafer support member is described below.

As shown in FIG. 12, the semiconductor wafer 310 is place d on the holding surface 304, and a direct-current high voltage of about 1000 V is applied to the electrode portions 302 through the lead terminal 308, so that the electrode portions 302 act as electrostatic attraction electrode, and therefore the semiconductor wafer 310 can be attracted and held on the holding surface 304 by generating Johnsen-Rahbeck force by coulombic force or feeble leakage current due to inductive polarization between the aluminum nitride film 303 and semiconductor wafer 310. Herein, in the wafer support member of the invention, since the maximum length L of the plural electrode portions 302 formed on the surface of the ceramic base body 301 is defined to be 5 cm or less, and hence warp is hardly observed in the ceramic base body 301, and the holding surface 304 may be finished to an excellent flatness. Hence, with minimum attraction fluctuations, the wafer 310 may be held at high precision.

Above the wafer support member, a metal plate (not shown) is disposed, and a high frequency electric power is applied to the electrode portions 302 from a high frequency power source, and plasma can be generated between the metal plate and electrode portions 302 at uniform plasma density. At this time, since the electrode portions 302 have thickness $T_1$ of 0.02 mm or more, if high frequency electric power is applied, they will not be heated or burnt down. Aside from the direct-current voltage for electrostatic attraction, if high frequency electric power for generating plasma is applied to the electrode portions 302, a filter for cutting high frequency may be placed between the wafer support member and the high voltage power source.

The aluminum nitride film 303 for covering the electrode portions 302 is high in purity and excellent in plasma resistance, and hence no adverse effects are caused in the particle or contamination of the wafer 310.

Moreover, since the resistance heating elements 307 are buried in the ceramic base body 301, by applying voltage through the lead terminal 309, the wafer support member can be heated and the wafer 310 can be heated uniformly. Still more, the resistance heating elements 307 having a band thin film pattern with thickness $T_3$ of 0.03 mm or less, and two-pole conductor layers 306 for communicating with the plural electrodes 302 formed on the ceramic base body 301 are only buried in the ceramic base body 301, so that a wafer support member of extremely high reliability is obtained, same as in general ceramic heater, without causing warp or breakage.

Embodiment 6

Herein, the wafer support member shown in FIG. 12 was fabricated, and its effects were investigated by experiment.

First, slurry was prepared by adding binder and solvent to aluminum nitride powder with purity of 99.9% or more, and plural green sheets were formed in a thickness of 0.5 mm by doctor blade method. On one of the green sheets, metal paste for resistance heating element adjusted in viscosity by mixing tungsten powder and aluminum nitride powder was formed in a band pattern by screen printing, and on a different green sheet, metal paste adjusted in viscosity by mixing tungsten powder and aluminum nitride powder was formed in wiring form by screen printing as shown in FIG. 13.

Laminating these green sheets, the remaining green sheets were further laminated, and were thermally compressed with a pressure of about 50 kg/cm$^2$ at 80° C. to form a laminate, which was further cut and processed into a disk plate, and pores of about 0.1 mm were pierced in the surface of the laminate, and metal paste was injected to conduct to the electrode portions 302.

Thus formed laminate was degreased in vacuum, and reduced and sintered at temperature of about 2000° C., thereby forming a ceramic base body 301 of 220 mm in outside diameter and 10 mm in thickness, burying resistance heating elements 307 and two-pole conductor layers 306 inside, being composed of aluminum nitride ceramics with thermal conductivity of 100 W/mk and volume resistivity of $10^{13}$ Ω·cm.

In addition, base bodies 301 were fabricated of ceramics such as high purity alumina with purity of 99%, silicon nitride and silicon carbide. Alumina, silicon nitride, aluminum nitride were fabricated similarly by doctor blade method, and silicon carbide was fabricated by hot press method. Each ceramic base body 301 had the material theoretical density of 98% or more, and the resistance heating elements 307 and conductor layers 306 buried in the ceramic base body 301 were all in the same shape by print pattern, and the resistance was 5 Ω, and the thickness $T_3$ was 0.03 mm or less.

A voltage of 100 V was applied to the resistance heating elements 307 of the ceramic base body 301 thus fabricated to heat to 400° C. The surface temperature of the ceramic base body 301 was confirmed by a surface temperature image processing apparatus, and, as shown in Table 9, the temperature distribution was extremely poor in the ceramic base body 301 made of silicon nitride, and it was found to be not usable.

In the ceramic base body 301 made of silicon carbide, since the resistance is small, distribution of the current applied to the resistance heating elements 307 was noted, and insulation could not be assured.

By contrast, in the ceramic base body 301 made of aluminum nitride or alumina, if heated, distribution of current was not recognized, and a sufficient insulation was confirmed, and the temperature distribution was not significantly variable. In particular, the aluminum nitride had a high thermal conductivity, and it was excellent with almost no temperature fluctuation.

As a result, as the ceramics for composing the ceramic base body 301, it is known that materials having the thermal conductivity of 20 W/mk and volume resistivity of $10^{10}$ Ω·cm should be selected.

TABLE 10

| | Thermal conductivity (W/mk) | Volume resistivity (Ω · cm) | Temperature distribution (°C.) | Overall evaluation |
|---|---|---|---|---|
| Aluminum nitride | 100 | $10^{13}$ | 1 | o |
| Alumina | 21 | $10^{16}$ | 15 | o |
| Silicon nitride | 14 | $10^{16}$ | 22 | X |
| Silicon carbide | 55 | $10^{8}$ | 9 | X |

Embodiment 7

The surface of the ceramic base body 301 made of aluminum nitride was polished to flatness of 1 μm or less and center line average roughness (Ra) of 1 μm or less, and electrode portions 302 differing in shape and thickness as shown in Table 11 were formed on the surface thereof so as to be connected electrically with via holes 305, and the warp of the ceramic base body 301 was studied.

The electrode portions 302 were formed by screen printing of paste of Kovar adjusted in viscosity by mixing titanium, copper and silver powder in electrode shapes, and heating at 1000° C. in vacuum.

The results are shown in Table 11.

TABLE 11

| | Structure of electrode | | | Warp of |
| --- | --- | --- | --- | --- |
| No. of electrodes | Electrode shape | Thickness of electrode (mm) | Max. length of electrode (cm) | ceramic base body ($\mu$m) |
| * 1 | 1 | Circular | 0.05 | 20 | 80 |
| * 2 | 2 | Semicircular | 0.05 | 10 | 30 |
| 3 | 4 | Sector | 0.05 | 5 | 1 |
| 4 | 8 | Sector | 0.05 | 2 | 0.6 |
| * 5 | 1 | Quadrilateral | 0.05 | 20 | 70 |
| * 6 | 2 | Quadrilateral | 0.05 | 10 | 26 |
| 7 | 4 | Quadrilateral | 0.05 | 5 | 0.9 |
| 8 | 1 | Quadrilateral | 0.05 | 5 | 0.5 |
| 9 | 1 | Quadrilateral | 0.50 | 5 | 1 |
| 10 | 4 | Quadrilateral | 0.50 | 5 | 1 |
| *11 | 1 | Quadrilateral | 0.60 | 5 | Broken |
| 12 | 8 | Quadrilateral | 0.05 | 2 | 0.6 |
| 13 | 12 | Quadrilateral | 0.05 | 2 | 0.6 |

* Out of the scope of the invention

As a result, regardless of the shape or thickness of the electrode portions 302, it is known that the warp of the ceramic base body 301 increases as the maximum length L of the electrode portions 302 increases. When the maximum lenght L of the electrode portions 302 exceeds 5 cm, the warp of the ceramic base body 301 is very obvious.

By contrast, at the maximum length L of the electrode portions 302 of 5 cm or less, the warp of the ceramic base body 301 may be controlled under 1 $\mu$m, and effects of warp could be ignored.

If the maximum length L of the electrode portions 302 is lager than 5 cm, by dividing the electrode portions 302 by grinding or processing so that the maximum length L of one electrode portion 302 may be smaller than 5 cm, the warp of the ceramic base body 301 could be controlled under 1 $\mu$m.

Hence, it is known that the warp of the ceramic base body 301 can be significantly decreased by defining the maximum length L of the electrode portions 302 under 5 cm.

Embodiment 8

Furthermore, preparing the ceramic base body 301 having electrode portions 302 of sample No. 7 in Table 11, wafer support members were fabricated by coating the electrode portions 302 with aluminum nitride film 303 varying in the film thickness $T_2$.

To form the aluminum nitride film 303, aluminum chloride, ammonia, hydrogen and nitrogen were used as reaction gas, and the film was formed at temperature of 800° to 1000° C. at reduced pressure of about 50 Torr, and by controlling the film forming time, the aluminum nitride film 303 was formed at various film thicknesses $T_2$ as shown in Table 12.

By applying a direct-current voltage of 1000 V to the electrode portions 302, the silicon wafer 310 was attracted and held, and insulation breakdown occurred at thickness $T_2$ of less than 0.005 mm.

By contrast, at film thickness $T_2$ of 0.01 mm or more, it was possible to attract stably without causing insulation breakdown. However, if the film thickness $T_2$ is over 0.5 mm, it took a longer time in forming the aluminum nitride film 303, and the production efficiency was poor.

As for attraction force, a constant attraction force was obtained at the film thickness $T_2$ in a range of 0.05 to 0.4 mm, and it was easy to handle as wafer support member.

As a result, the film thickness $T_2$ of the aluminum nitride film 303 is found to be preferred in a range of 0.01 to 0.5 mm, more preferably 0.05 to 0.4 mm.

TABLE 12

| Film thickness $T_2$ of aluminum nitride film (mm) | Anti-voltage at 1 kV | Attraction force (g/cm$^2$) |
| --- | --- | --- |
| 0.005 | Broken (X) | — |
| 0.01 | o | 220 |
| 0.05 | o | 130 |
| 0.1 | o | 126 |
| 0.2 | o | 120 |
| 0.4 | o | 115 |
| 0.4 | o | 60 |

The wafer support member of the invention was set in an etching apparatus, fluorine gas was supplied, and a high frequency electric power of 800 W, 13.56 MHz was applied from a high frequency power source; as a result, the electrode portions 302 had a sufficient thickness $T_1$ of 0.02 mm or more, and were not heated or burnt down at high frequency. Moreover, the electrode portions 302 and aluminum nitride film 303 formed on the ceramic base body 301 had a uniform thickness, and hence the plasma density on the wafer 310 was constant, so that a desired integrated circuit could be formed on the silicon wafer.

Thus, in the invention, a plurality of electrode portions in a thickness of 0.02 mm or more and maximum length of 5 cm or less are formed on the surface of the ceramic base body, and the holding surface is formed by coating the electrode portions with aluminum nitride film of 0.01 to 0.5 mm in thickness, thereby constituting the wafer support member, and hence the holding surface has a high precision of flatness, and the semiconductor wafer can be held with a uniform attraction force, and the electrode portions also function as the plasma generating electrode, aside from the function as electrostatic attraction electrode, so that a wafer support member of compact design and extremely high efficiency is realized.

Moreover, the aluminum nitride film is excellent in plasma resistance, and is hence long in life, and the semiconductor wafer is free from adverse effects such as contamination and particle.

Inside the ceramic base body, conductor layers and resistance heating elements are buried to keep conduction with the electrode portions, and an extremely high reliability is obtained same as in general ceramic heater.

In the invention, furthermore, the ceramic base body is formed of ceramics having high thermal conductivity and volume resistivity, and the electrode portions are formed on tungsten, molybdenum or Kovar, and hence the uniform heating performance is excellent and the semiconductor wafer can be heated uniformly.

Accordingly, when the film is formed on the semiconductor wafer by using the wafer support member of the invention, the film can be formed at high precision, and by fine processing on the semiconductor wafer, it is possible to process to specified dimensions at high precision.

The embodiment is specifically described below.

Figure 15:
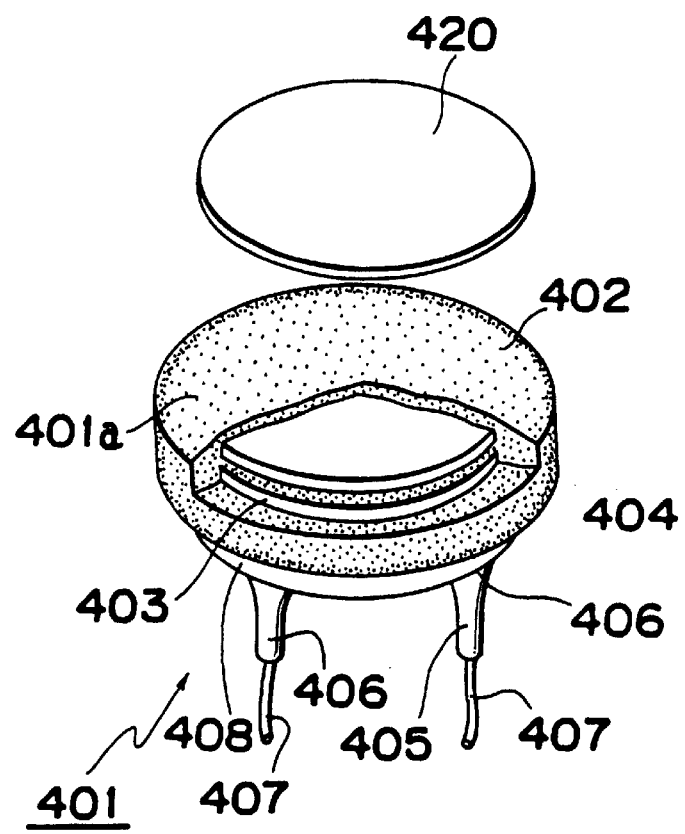
FIG. 15 is a partially cut-away perspective view showing a wafer support member as an example of a wafer holding device of the invention.
Figure 16:
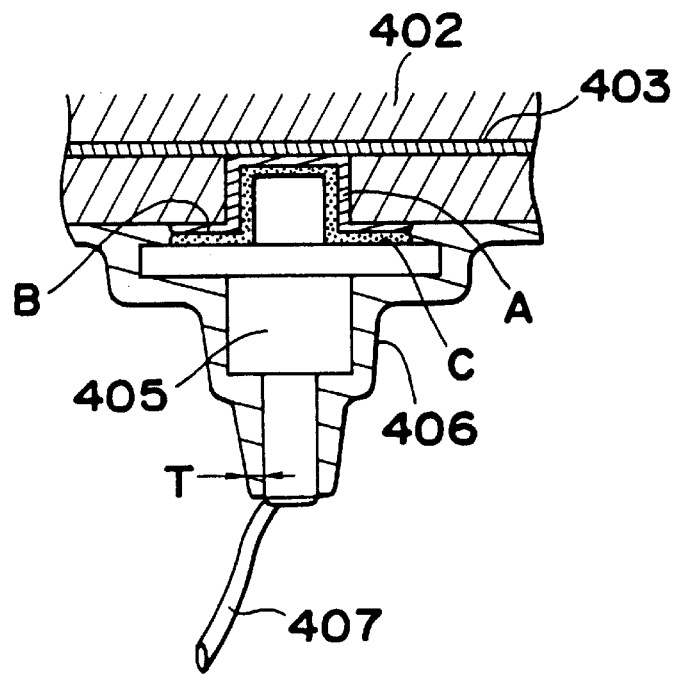
FIG. 16 is a magnified sectional view showing the vicinity of lead terminal junction in FIG. 15.

FIG. 15 is a partially cut-away perspective view showing a wafer support member 401 as an example of wafer holding device relating to the embodiment of the invention, in which resistance heating elements 403 are buried downward in a base body 402 made of aluminum nitride sintered body, and electrostatic electrodes 404 upward therein. In the lower side of the base body 402, as shown in FIG. 16, inner holes A communicating with the resistance heating elements 403 and electrostatic electrodes 404 are pierced, and a metalized layer B made of molybdenum-manganese alloy is laid on the surface of the inner holes A, and metal lead terminals 405 made of tungsten or molybdenum are bonded through solder C containing silver.

Figure 17:
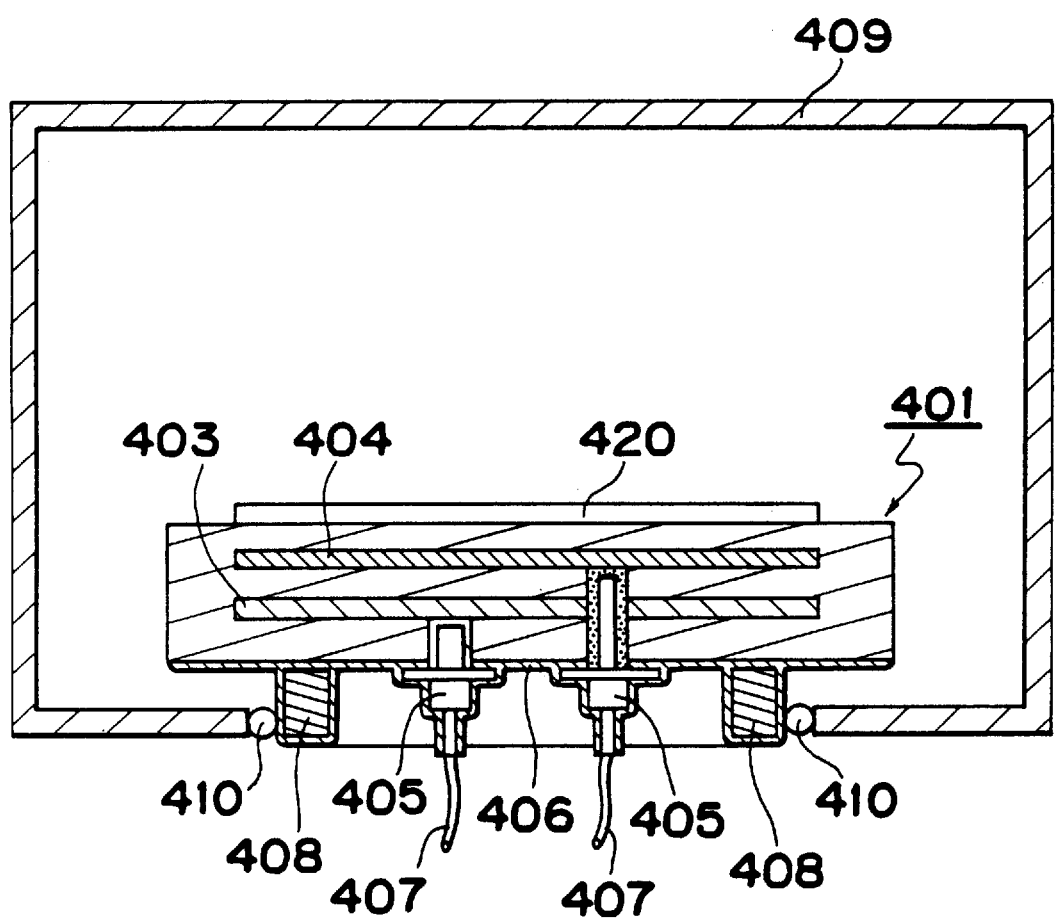
FIG. 17 is a sectional view showing a state of disposition of the wafer support member in FIG. 15 in a treating chamber of a film forming device.
Figure 18:
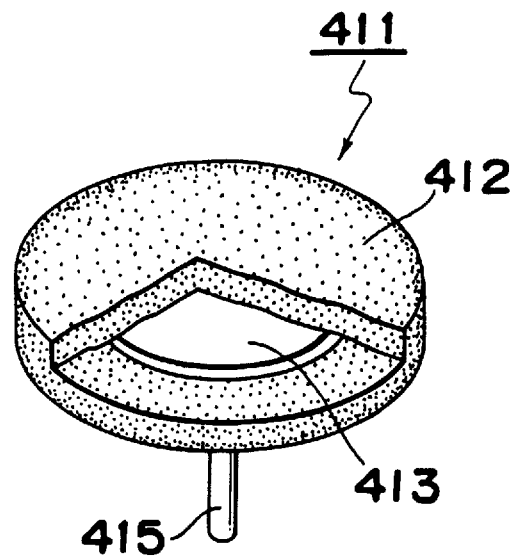
FIG. 18 is a partially cut-away perspective view showing a susceptor as a conventional wafer holding device.
Figure 19:
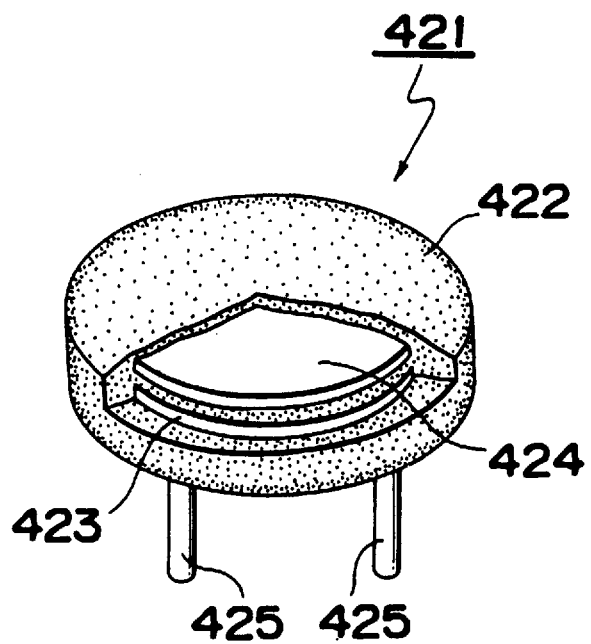
FIG. 19 is a partially cut-away perspective view showing a wafer support member as a conventional wafer holding device.
Figure 20:
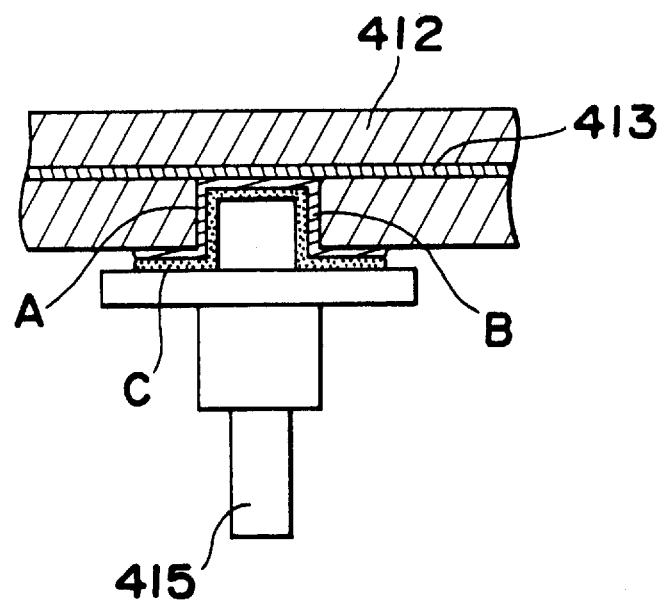
FIG. 20 is a magnified sectional view showing the vicinity of the lead terminal junction in FIG. 17 and FIG. 18.

In the lower surface of the base body 402, a rink-shaped seal member 408 is bonded so as to wrap the lead terminals 405, and it is designed to seal through an O-ring 410 placed between the seal member 408 and treating chamber 409 of film forming device as shown in FIG. 17.

The entire lower surface of the base body 402 containing the lead terminals 405 and seal member 408 is covered with a ceramic film 406 composed of one of silicon carbide, silicon nitride, sialon, and aluminum nitride, and a lead wire 407 is connected to the leading end of each lead terminal 405 so as to feed power.

Using this wafer support member 401, in order to form a film on the wafer 420, such as semiconductor wafer or glass substrate for liquid crystal, first the wafer 420 is put on a platform 401a, and film forming gas is supplied into the treating chamber 409. By applying a voltage between the wafer 420 and electrostatic electrode 404, coulombic force by inductive polarization or Johnsen-Rhabeck force by feeble leakage current is generated, and the wafer 420 is attracted and fixed onto the platform 401a, and by feeding power to the resistance heating elements 403 to heat the wafer 420 to specified temperature, a thin film can be formed on the wafer 420. In particular, in the wafer support member 401 of the invention, since the base body 402 is formed of aluminum nitride sinter having high thermal conductivity among other ceramics, and therefore the wafer support member 401 itself can be heated in a shot time, and the wafer 420 is heated uniformly, so that a thin film of high precision can be formed.

At this time, the lower surface of the wafer support member 401 is exposed in the atmosphere, and the wafer support member 401 itself is heated to high temperature over 600° C., and hence the lead terminals 405 for feeding power to the resistance heating elements 403 and electrostatic electrode 404 are oxidized, and the solder C for bonding the lead terminals 405 reacts with oxygen in the atmosphere to corrode, but the wafer support member 401 of the invention is excellent in the oxidation resistance in the entire lower surface of the base body 402 including the lead terminals 405, and it is covered with the ceramic film 406 composed of one of silicon carbide, silicon nitride, sialon, and aluminum nitride, similar on coefficient of thermal expansion to that the aluminum nitride sinter for composing the base body 402, and therefore if the wafer support member 401 is heated to high temperature, the ceramic film 406 will not be peeled off, and deterioration of characteristic due to oxidation of lead terminals 405 or dropout of lead terminals 405 due to corrosion of solder C can be prevented.

However, in order to prevent oxidation of lead terminals 405 and corrosion of solder C completely, the film thickness of the covering ceramic film 406 is preferred to be 0.001 mm or more.

That is, if the film thickness of the ceramic film 406 is less than 0.001 mm, the ceramic film 406 is too thin to prevent oxidation of lead terminals 405 and corrosion of solder C sufficiently. If the film thickness of the ceramic film 406 is more than 1.0 mm, it not only takes a long time in forming film, but the working efficiency is poor.

Therefore, an optimum film thickness range of the ceramic film 406 is 0.001 to 1.0 mm, preferably 0.015 to 1.0 mm.

On the other hand, to manufacture the wafer support member 401 shown in FIG. 15, first two layers of green sheet made of aluminum nitride coated with conductive metal such as tungsten, molybdenum, titanium carbide, titanium nitride, and tungsten carbide is laminated, and a green sheet of aluminum nitride is laid on the outermost layer to form a laminate. At this time, the conductive metal to be applied on the green sheet may be mixed slightly with aluminum nitride powder to enhance the contact tightness, while minimizing the difference in thermal expansion from the green sheets composing the base body 402. The obtained laminae is cut and processed into a disk plate, and is based at temperature of 1600° to 1950° C. in non-oxidizing atmosphere, thereby forming a base body 402 in which resistance heating elements 403 and electrostatic electrode 404 are buried.

Next, to bond the lead terminals 405 to the resistance heating elements 403 and electrostatic electrode 404 buried in the base body 402, inner holes A are pierced in the surface of the base body 402, and paste of molybdenum-manganese alloy or the like is applied on the inner holes A, and a metalized layer B is formed by baking in a temperature range of 1200° to 1500° C., and the lead terminals 405 are inserted into the inner holes A forming the metalized layer B, and bonded with solder C. Around the lead terminals 405, a rink-shaped seal member 408 made of tungsten is bonded to the lower surface of the base body 402 through solder C. As the material for the lead terminals 405, from the viewpoint of enhancing contact tightness with the base body 402, it is preferred to use metal such as tungsten and molybdenum, and the solder C should preferably contain silver excellent in heat resistance.

Then, the entire lower surface of the base body 402 containing the lead terminals 405 and seal member 408 is coated with a ceramic film 406 made of at least one of silicon carbide, silicon nitride, sialon, and aluminum nitride, in a film thickness of 0.001 to 1 mm, by PVD method such as sputtering and ion plating, CVD method or thin film forming means, so that the wafer support member 401 shown in FIG. 15 may be obtained.

In the embodiment, the entire lower surface of the wafer support member 401 is coated with ceramic film 406, but it is enough when at least the lead terminals 405 and their junction are coated with ceramic film 406.

The embodiment relates to the wafer support member 401, but the susceptor burying the resistance heating elements may be also manufactured similarly by coating the led terminals and their junction with ceramic film 406 made of at least one of silicon carbide, silicon nitride, sialon, and aluminum nitride.

Embodiment 9

A wafer support member 401 composed of aluminum nitride sintered body in which resistance heating elements 403 and electrostatic electrode 404 was fabricated, and the lead terminals 405 for feeding power to the electrodes 403, 404 were coated with ceramic films 406 of two kinds of aluminum nitride film and silicon carbide film, and thus the wafer support member 401 of the invention was obtained, and as comparative examples, the wafer support member 401 having the lead terminals 405 coated with alumina film, and the wafer support member 401 having the lead terminals 405 not coated with ceramic film 406 were prepared, durability tests were conducted.

In wafer support member 401 of each sample, $Y_2O_3$ was added to aluminum nitride powder by 2 wt. %, and binder and solvent were added to obtain slurry, and a plurality of green sheets were formed by doctor blade method. On two green sheets thereof, tungsten paste adding aluminum nitride powder by about 2 wt. % was screen printed in a thickness of 30 μm, and they were held with other green sheets to form a laminate, which was cut and processed in a disk plate. Afterwards, the disk plate was baked in nitrogen atmosphere at baking temperature of about 1750° C., thereby forming a wafer support member 401 in a thickness of about 5 mm in which the resistance heating elements 403 and electrostatic electrode 404 were buried as shown in FIG. 15. The porosity of the aluminum nitride sintered body for composing the base body 402 of this wafer support member 401 was about 2.0%.

Consequently, in the lower surface of the wafer support member 401, inner holes A of about 3 mm in diameter were pierced so as to communicate with the resistance heating elements 403 and electrostatic electrode 404, and paste mainly composed of molybdenum-manganese alloy was applied, and a metalized layer was formed by baking in forming gas at temperature of 1350° C., and molybdenum-made lead terminals 405 were inserted into the inner holes A through the solder C containing silver, and by baking at temperature of about 1100° C. in vacuum, the lead terminals 405 were bonded to the base body 402.

Four wafer support members 401 thus obtained were prepared, and the lower surface of the three of the waver support members 401 was coated with an aluminum nitride film, a silicon nitride film, and an alumina film, in a film thickness of about 0.015 mm, by using CVD apparatus.

By applying voltage to the resistance heating elements 403 of these wafer support members 401 to heat to about 600° C., the samples were left in the atmosphere, and the time to change of resistance value of the lead terminals was measured.

Results are shown in Table 13.

TABLE 13

| | Film material | 10 hours | 30 hours | 50 hours | 100 hours | 1000 hours |
|---|---|---|---|---|---|---|
| The invention | AlN | o | o | o | o | o |
|  | Si₃N₄ | o | o | o | o | o |
| Comparative examples | Al₂O₃ | o | o | o | X | X |
|  | None | X | Terminal dropout | — | — | — | o Resistance value not changed
X Resistance value changed

As known from the results, the wafer support member 401 of which lead terminals 405 were not coated with ceramic film 406 changed in the resistance value of lead terminals 405 in 10 hours, and the lead terminals dropped out in 50 hours of use.

In the wafer support member 401 of which lead terminals 405 were coated with alumina film, the alumina film was cracked before reaching 100 hours, and the resistance value of the lead terminals 405 changed.

By contrast, in the wafer support members 401 of the invention of which lead terminals 405 were coated with aluminum nitride film and silicon nitride film, no abnormality was found in the ceramic film 406 even after use of 1000 hours, and the resistance value of the lead terminals 405 did not change at all.

The wafer support members 401 of the invention were coated with aluminum nitride film 406 at different film thicknesses, and durability was tested until the resistance value of the molybdenum-made lead terminals 405 was changed.

The film thicknesses of aluminum nitride film 406 and the results are shown in Table 14.

TABLE 14

| | Film thickness (mm) | Time to change of resistance value |
|---|---|---|
| 1 | 0.0008 | 25 hours |
| 2 | 0.002 | 920 hours |
| 3 | 0.015 | More than 1000 hours |
| 4 | 0.140 | More than 1000 hours |
| 5 | 0.830 | More than 1000 hours |

As understood from Table 14, when coated with aluminum nitride film 406 in a film thickness of 0.0008 of sample No. 1, the lead terminals 405 were oxidized in 25 hours, and the resistance value changed, but in samples No. 2 to No. 5, the film thickness of the aluminum nitride film 406 was over 0.001 mm, and the time until change of resistance value of the lead terminals 405 was more than 900 hours, and was dramatically extended. In particular, in samples No. 3 to No. 5 coated with aluminum nitride film 405 in a film thickness of 0.015 mm or more, if heated for 1000 hours, the resistance value of the lead terminals 405 were not changed at all.

It is hence known that oxidation of the lead terminals 405 can be prevented for a long period when the film thickness of the aluminum nitride film 405 is at least 0.001 μm or more, preferably 0.015 mm or more.

In this experiment, the ceramic film 406 for covering the lower surface of the wafer support member 401 is aluminum nitride film and silicon nitride film, but similar effects were obtained in other silicon carbide film and sialon film.

Thus, the invention provides the wafer holding device comprising at least resistance heating elements in the base body composed of aluminum nitride sinter, and comprising lead terminals for feeding power to the resistance heating elements in the lower surface of the base body, wherein at least the lead terminals and their junction are covered with a ceramic film of at least one kind of silicon nitride, silicon carbide, sialon, and aluminum nitride, and therefore if the wafer holding device is heated for heating the semiconductor wafer or glass substrate for liquid crystal, oxidation of lead terminals or corrosion of solder will not occur. Accordingly, it presents a wafer holding device capable of heating stably for a long period without causing deterioration of characteristics of lead terminals.

What is claimed is:

1. A wafer support member comprising:
   a ceramic base body,
   a plurality of electrode portions with thickness of 0.02 mm or more and maximum length of 5 cm or less on the surface of the ceramic base body, and
   a holding surface formed on each electrode portion with an aluminum nitride film with thickness of 0.01 to 0.5 mm.

2. A wafer support member of claim 1, wherein heating resistance elements for heating are buried in the ceramic base body.

3. A wafer support member of claim 1 further comprising a source of direct-current high voltage and high frequency voltage, wherein the electrode portions function as plasma generating electrode, as well as electrostatic attraction electrode, by applying the direct-current high voltage for electrostatic attraction and the high frequency voltage for plasma generation.

4. The wafer support member of claim 1, wherein the ceramic base body is composed of ceramics with the volume resistivity of $10^{10}$ Ω·cm or more and thermal conductivity of 20 W/m·K or more, and the electrode portions are composed of at least one of tungsten, molybdenum and Kovar.

5. A wafer holding device for holding a wafer such as semiconductor wafer and glass substrate for liquid crystal, the wafer holding device comprising:
   a base body of aluminum nitride sintered body, the base body defining a lower surface and containing resistance heating elements therein, and
   lead terminals for feeding power to the resistance heating elements in the lower surface of the base body, wherein at least the lead terminals and junction thereof are coated with a ceramic film composed of any one of silicon carbide, silicon nitride, sialon, and aluminum nitride.

6. A wafer support member, comprising:
   a ceramic body having an attraction surface,
   an internal electrode buried in the ceramic body,
   a base plate, and
   an adhesive layer bonding the ceramic body and the base plate, the adhesive layer comprising at least one of indium and an indium alloy.

7. The wafer support member of claim 6, wherein the adhesive layer is comprised of 40 to less than 100 wt. % of indium and at least one of Sn, Ag, Pb, Zn and Al by greater than 0 to 60 wt. %.

8. An attraction device, comprising:
   a base body comprising at least one of a metal and a ceramic,
   the base body having a flat surface for forming an attraction surface, an outer circumference and penetration holes, the penetration holes opening in said flat surface, each of the penetration holes having an inner wall,
   the outer circumference and the inner wall of each of the penetration holes of the base body defining an angle with the flat surface, the angle being not greater than about 80°, and
   an aluminum nitride film covering the flat surface, the outer circumference, and the inner wall of each of the penetration holes.

9. An attraction device, comprising:
   a base body comprising at least one of a metal and a ceramic,
   the base body having a flat surface for forming an attraction surface and penetration holes opening in said flat surface, each of the penetration holes having an inner wall,
   the base body having an outer circumference with a boundary that is chamfered to a C-form or R-form with the outer circumference and the flat surface, and
   an aluminum nitride film covering the flat surface, the outer circumference, and the inner wall of each of the penetration holes.

10. The attraction device of claim 9, wherein a ratio of the chamfered boundary to an overall thickness of the base body is at least 1/16.

11. A wafer support member, comprising:
    a metallic electrode plate having a surface and a thickness of not less than 0.5 mm,
    a ceramic base body having a thickness of not less than 3 mm,
    the metallic electrode plate and the base body being bonded, and
    an attraction surface coated with an aluminum nitride film having a thickness of between 0.01 mm and 0.5 mm formed on the surface of the electrode plate.

12. The wafer support member of claim 11, comprising:
    heating resistance elements buried in the ceramic base.

13. The wafer support member of claim 11, wherein
    the electrode plate comprises a plasma generating electrode to which a high frequency voltage is applied for plasma generation.

14. The wafer support member of claim 11, wherein
    the electrode plate comprises an electrostatic attraction electrode to which a direct current high voltage is applied for electrostatic attraction.

15. The wafer support member of claim 11, wherein the base body and electrode plate are partly bonded and form a mutual junction boundary and wherein at least one of helium and argon gas is introduced in the mutual junction boundary.

16. The wafer support member of claim 11, wherein the base body comprises ceramic with a volume resistivity of not less than $10^{10}$ Ω·cm and a thermal conductivity of not less than 20 W/m·K, and the electrode plate comprises at least one of tungsten, molybdenum and Kovar.

17. A wafer support member comprising:
    a base made of ceramics with thickness of 3 mm or more,
    a metallic electrode plate with thickness of 0.5 mm or more bonded onto the base,
    an attraction surface composed of an aluminum nitride film with thickness of 0.01 to 0.5 mm coated on the surface of the electrode plate, and
    a source of direct-current high voltage and high frequency voltage,
    wherein the electrode plate functions as plasma generating electrode, as well as electrostatic attraction electrode, by applying the direct-current high voltage for electrostatic attraction and the high frequency voltage for plasma generation.

* * * * *